(12) United States Patent
Kim et al.

(10) Patent No.: US 8,629,494 B2
(45) Date of Patent: Jan. 14, 2014

(54) DATA STORING DEVICES AND METHODS OF FABRICATING THE SAME

(75) Inventors: Yong Kwan Kim, Yongin-si (KR); Youngnam Hwang, Hwaseong-si (KR)

(73) Assignee: Samsung Electronics Co Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/585,146

(22) Filed: Aug. 14, 2012

(65) Prior Publication Data

US 2013/0043530 A1    Feb. 21, 2013

(30) Foreign Application Priority Data

Aug. 16, 2011    (KR) .................. 10-2011-0081364

(51) Int. Cl.
*H01L 29/78*    (2006.01)

(52) U.S. Cl.
USPC .................... 257/334; 257/E29.262

(58) Field of Classification Search
None
See application file for complete search history.

(56) References Cited

U.S. PATENT DOCUMENTS

| 7,862,991 | B2 | 1/2011 | Jung |
| 2008/0296674 | A1 | 12/2008 | Graham et al. |
| 2011/0127605 | A1* | 6/2011 | Kim ............................ 257/334 |
| 2011/0133270 | A1* | 6/2011 | Juengling .................... 257/331 |

FOREIGN PATENT DOCUMENTS

| JP | 2008-300843 | 12/2008 |
| KR | 10-2007-0003138 A | 1/2007 |
| KR | 10-0753105 B1 | 8/2007 |
| KR | 10-2008-0106116 A | 12/2008 |

\* cited by examiner

*Primary Examiner* — Thomas L Dickey
*Assistant Examiner* — Joseph Schoenholtz
(74) *Attorney, Agent, or Firm* — Lee & Morse, P.C.

(57) ABSTRACT

A data storing device may include a substrate, transistors on the substrate that include gate line structures, and conductive isolation patterns defining active regions of the transistors. Each conductive isolation pattern includes at least one portion buried in the substrate and the conductive isolation patterns are electrically connected with each other.

15 Claims, 39 Drawing Sheets

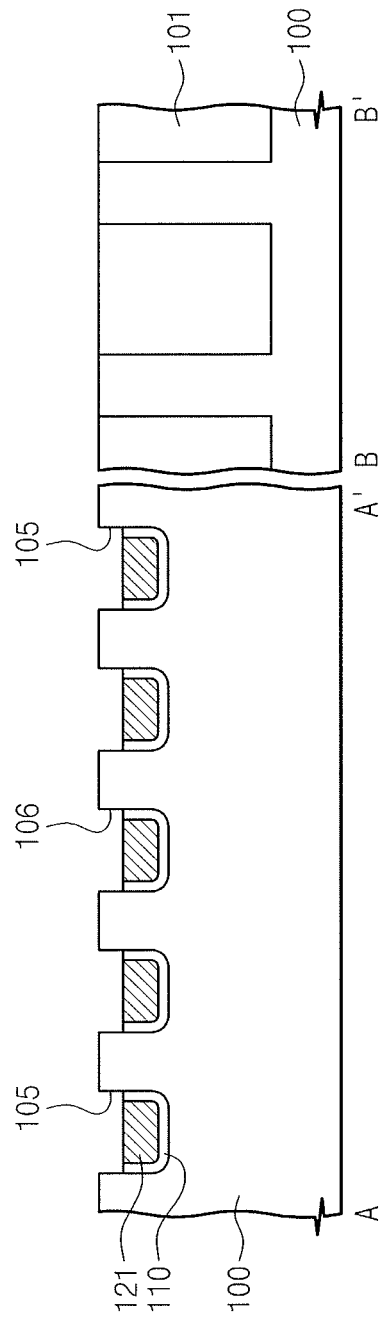

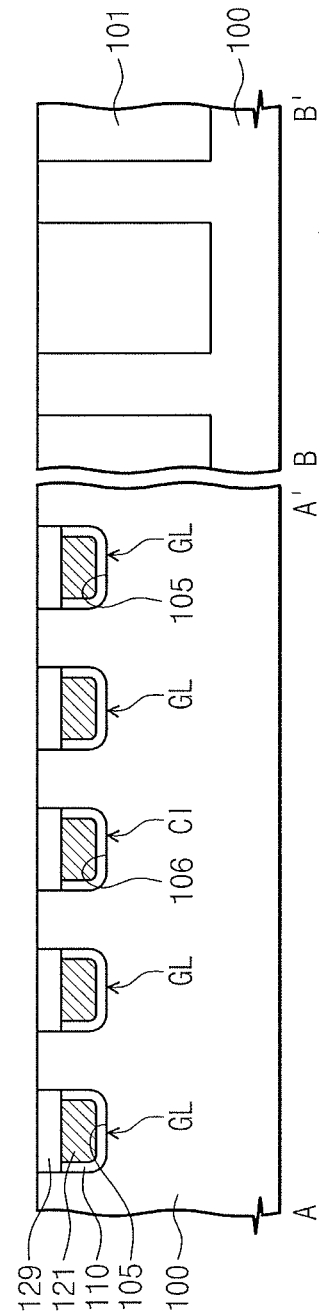

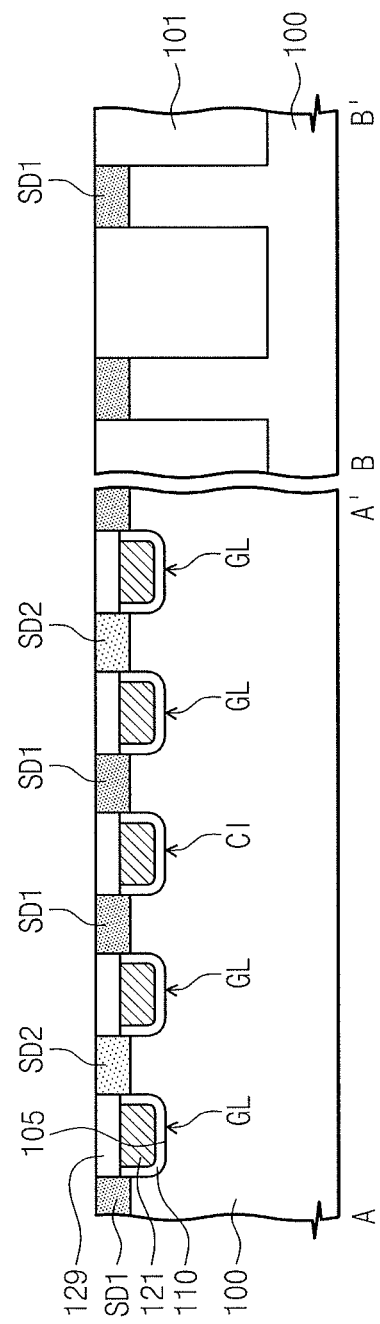

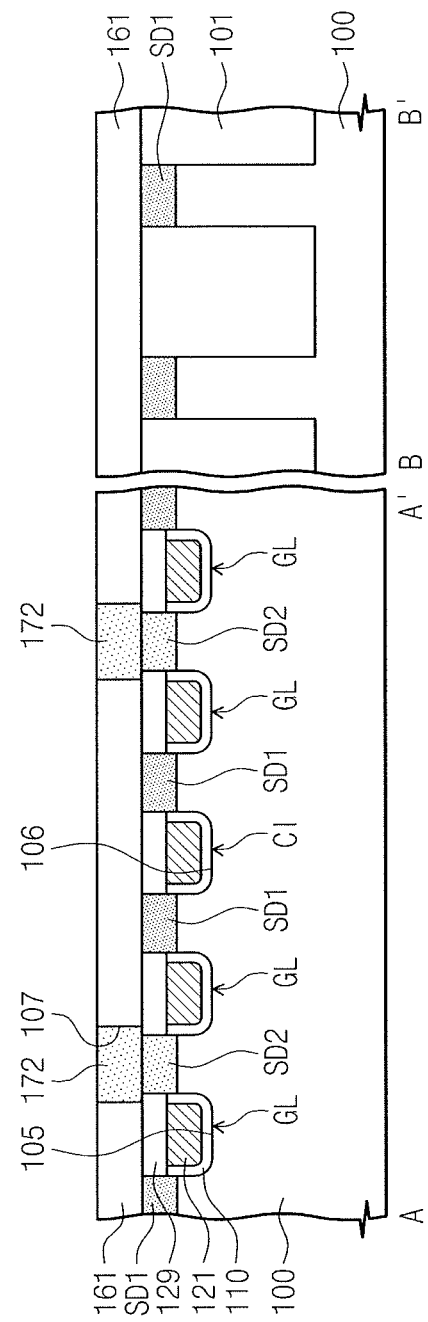

DATA STORING DEVICES AND METHODS OF FABRICATING THE SAME

CROSS-REFERENCE TO RELATED APPLICATION

Korean Patent Application No. 10-2011-0081364, filed on Aug. 16, 2011, in the Korean Intellectual Property Office, and entitled: "Data Storing Devices and Methods of Fabricating the Same," is incorporated by reference herein in its entirety.

BACKGROUND

Due to their small-size, multi-functionality, and/or low-cost characteristics, semiconductor devices are being esteemed as important elements in the electronic industry. Higher integration of data storing devices, such as semiconductor memory devices, should satisfy consumer demands for superior performance and inexpensive prices. In the case of semiconductor memory devices, increased integration is sought after because integration is an important factor in determining product prices. However, the high price of process equipment needed to increase the fineness of semiconductor patterns sets a practical limitation on increasing integration of semiconductor memory devices. Accordingly, a variety of studies on new technology for increasing integration density of a data storing device are being conducted.

SUMMARY

Embodiments may be realized by providing a data storing device that includes a substrate, transistors on the substrate that include gate line structures, and conductive isolation patterns defining active regions of the transistors. Each conductive isolation pattern includes at least one portion buried in the substrate, and the conductive isolation patterns are electrically connected with each other.

Each of the gate line structures may include at least one portion buried in the substrate. The conductive isolation patterns may extend substantially parallel to the gate line structures. Each of the conductive isolation patterns and the gate line structures may include an insulating layer, a conductive line, and a capping pattern that are sequentially stacked on the substrate. The conductive line may be electrically isolated from the substrate by the insulating layer and the capping pattern.

In each of the conductive isolation patterns and the gate line structures, an uppermost surface of the conductive line may be lower than an uppermost surface of the substrate. The gate line structures may be provided in first trenches within the substrate and the conductive isolation patterns may be provided in second trenches within the substrate. The first trenches and the second trenches may have substantially same depths.

The device may include a conductive connecting pattern electrically connecting the conductive isolation patterns with each other. The conductive connecting pattern may extend along a direction that crosses the gate line structures.

The conductive isolation patterns may be configured to hinder a channel region formation in regions of the substrate under the conductive isolation patterns, during an operation of the data storing device. The conductive isolation patterns may be configured to receive a ground or negative voltage, during an operation of the data storing device. The conductive isolation patterns may be configured to have applied thereto a same voltage as that applied to unselected gate line structures of the gate line structures, during reading and writing operations of the data storing device.

The transistors may include second source/drain regions in the substrate between the gate line structures, and first source/drain regions spaced apart from the second source/drain regions by the gate line structures. The data storing device may include source lines that are on the second source/drain regions and that extend along the gate line structures.

The device may include a source connecting line electrically connecting the source lines with each other. The gate line structures may include conductive lines, respectively, and lowermost surfaces of the source lines may be higher than uppermost surfaces of the conductive lines. The may include device isolation layers crossing the gate line structures and defining the active regions of the transistors. The second source/drain regions may be spaced apart from each other by the device isolation layers in a direction parallel to the gate line structures.

Each of the source lines may include a first conductive pattern and a second conductive pattern. The first conductive pattern may be in contact with the one of the second source/drain regions and the first conductive pattern may include a semiconductor material. The second conductive pattern may be on the first conductive pattern and the second conductive pattern may include a metallic material.

The device may include variable resistance structures. Each of the variable resistance structures may be electrically connected to a corresponding one of the first source/drain regions.

Embodiments may also be realized by providing a method of manufacturing a data storing device that includes providing a substrate that includes a plurality of first trenches and a plurality of second trenches formed in a cell array region of the substrate, forming gate line structures for transistors in the first trenches, forming conductive isolation patterns in the second trenches such that each of the conductive isolation patterns are formed between adjacent ones of the gate line structures, and forming a conductive connecting pattern connected to each of the conductive isolation patterns. The conductive connection pattern is separated from each of the gate line structures.

The method may include forming first source/drain regions and second source/drain regions, and forming source lines. The gate line structures for transistors and the conductive isolation patterns may be formed parallel to each other. The source lines may be formed to overlap the second source/drain regions and may formed to be spaced apart from the first source/drain regions. Each of the conductive isolation patterns may be formed between adjacent ones of the first source/drain regions. Each of the gate line structures may be formed between one of the first source/drain regions and one of the second source/drain regions.

The gate line structures and the conductive isolation patterns may be simultaneously formed. Simultaneously forming the gate line structures and the conductive isolation patterns may include sequentially forming an insulating layer, a conductive line, and a capping pattern within the first and second trenches of the substrate.

The method may include forming variable resistance structures and bit lines. The bit lines may be formed to cross the gate lines structures and the conductive isolation patterns. The bit lines may be formed to connect the variable resistance structures with each other and the bit lines may be separately formed from the conductive connecting pattern. The variable resistance structures may be formed connected to the first source/drain regions via contact plugs and separated from the second source/drain regions.

BRIEF DESCRIPTION OF THE DRAWINGS

Features will become apparent to those of ordinary skill in the art by describing in detail exemplary embodiments with reference to the attached drawings in which:

FIGS. 5A through 12A and 5B through 12B illustrate sectional views depicting stages in methods of fabricating a data storing device according to exemplary embodiments;

FIGS. 15A through 21A and 15B through 21B illustrate sectional views depicting stages in methods of fabricating a data storing device according to exemplary embodiments

DETAILED DESCRIPTION

Figure 1:
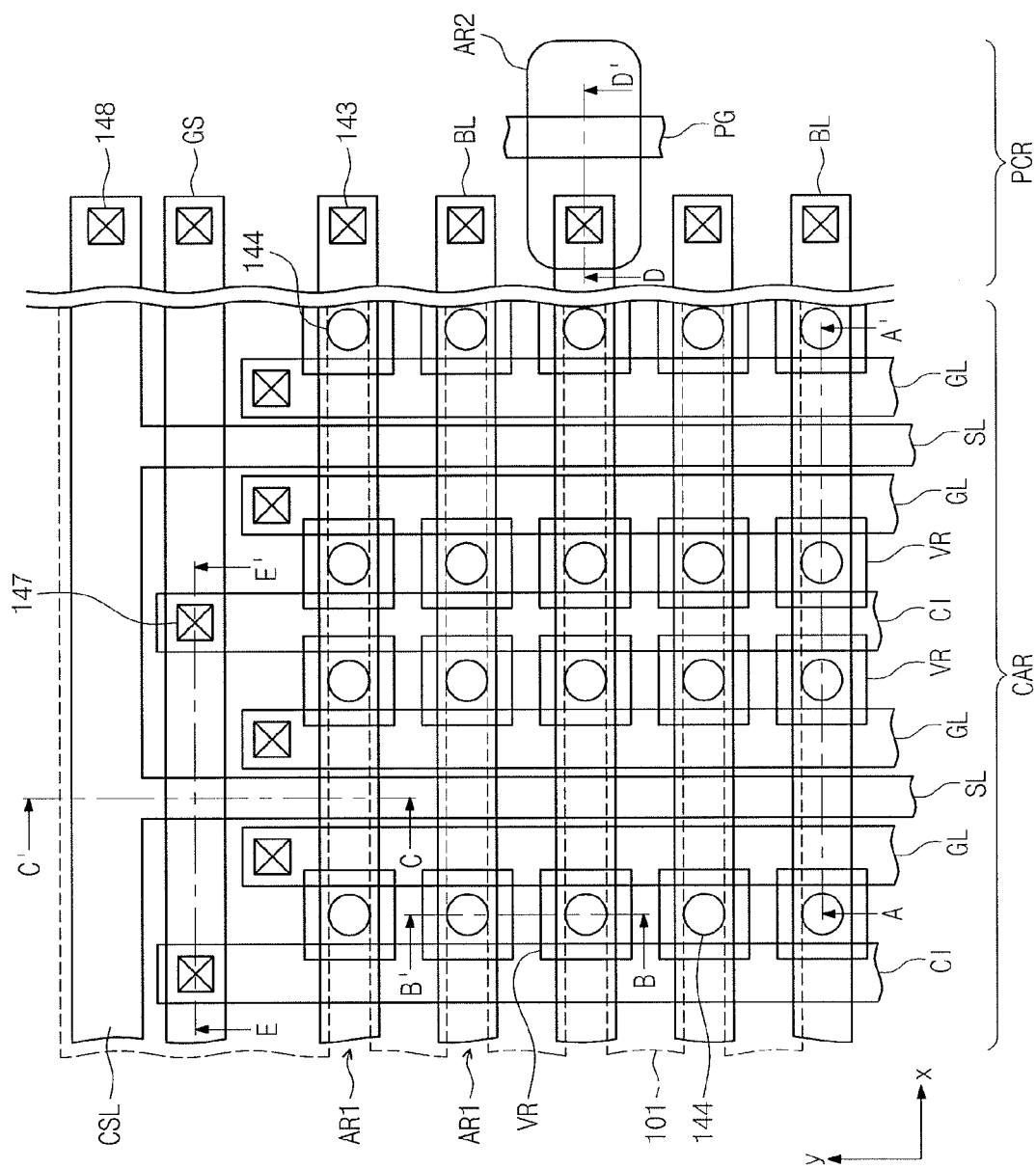
FIG. 1 illustrates a plan view of a data storing device according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It should be noted that the drawing figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Exemplary embodiments are described herein with reference to cross-sectional illustrations that are schematic illustrations of idealized embodiments (and intermediate structures) of example embodiments. As such, variations from the shapes of the illustrations as a result, e.g., of manufacturing techniques and/or tolerances, may be expected. Thus, embodiments should not be construed as limited to the particular shapes of regions illustrated herein but are to include deviations in shapes that result, e.g., from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2A:
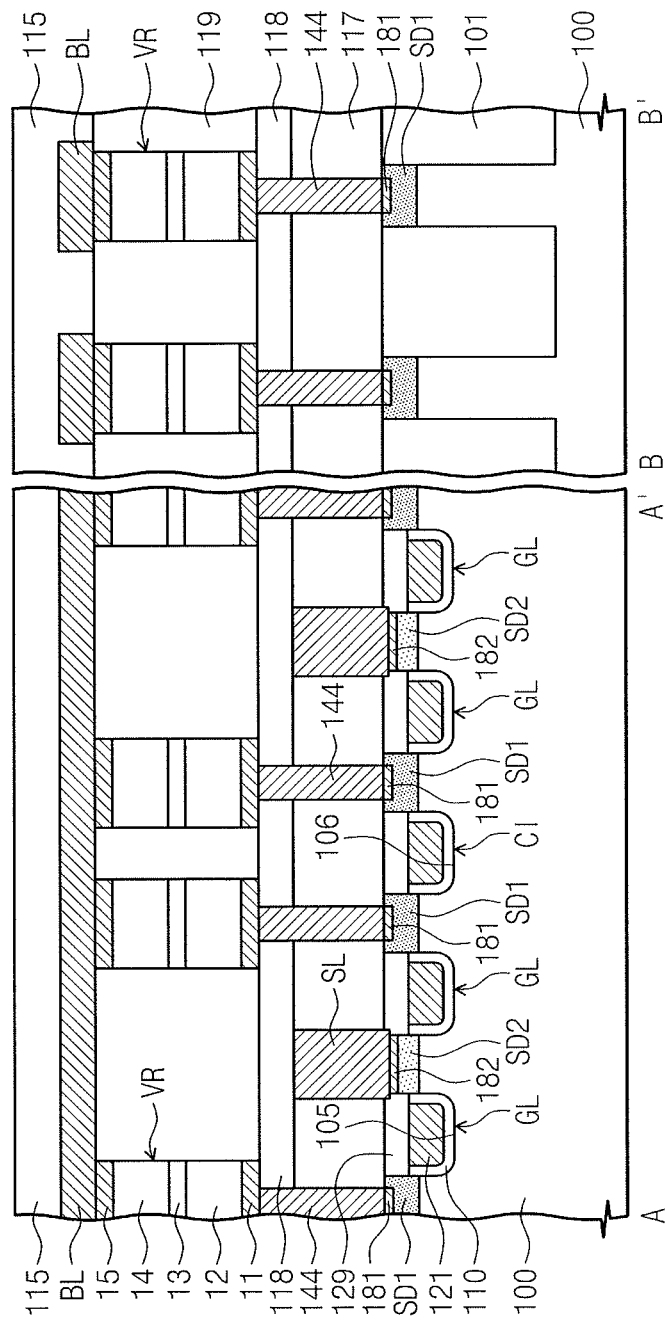
FIGS. 2A through 2C illustrate sectional views of the data storing device illustrated in FIG. 1.
Figure 2B:
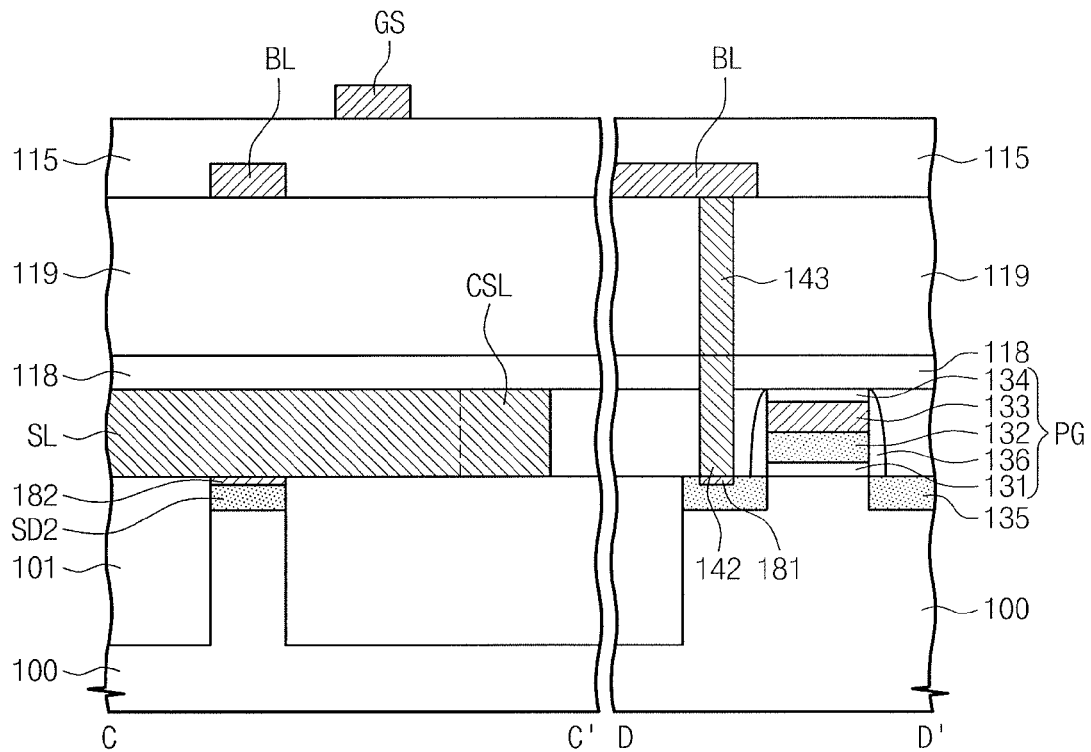
Figure 2C:
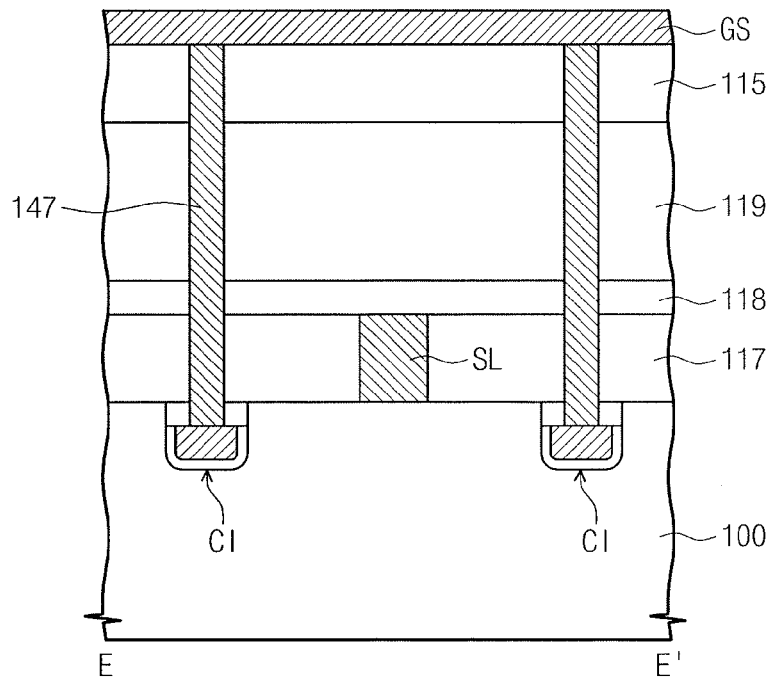

FIG. 1 illustrates a plan view of a data storing device according to a first embodiment. FIGS. 2A through 2C illustrate sectional views of the data storing device. In more detail, FIGS. 2A through 2C illustrate various sectional views taken along ones of lines A-A', B-B', C-C', D-D', and E-E' of FIG. 1.

Referring to FIGS. 1 and 2A through 2C, a substrate 100 including a cell array region CAR and a peripheral circuit region PCR may be provided. The substrate 100 may be one of a semiconductor layer, an insulating layer, a semiconductor, or conductive layer covered with an insulating layer. For example, the substrate 100 may be a silicon wafer. In some embodiments, the substrate 100 may include a region lightly doped with p-type impurities. Device isolation layers 101 may be arranged in the substrate 100 to define a first active region AR1 therebetween within the cell array region CAR and a second active region AR2 therebetween in the peripheral circuit region PCR. The first active region AR1 may be shaped like a rectangle extending, e.g., elongated, parallel to a specific direction (e.g., an x direction).

Transistors including gate line structures GL may be provided on the cell array region CAR. The gate line structures GL may be excluded in the peripheral circuit region PCR. In some embodiments, at least a portion of the gate line structures GL may be inserted into a top surface of the substrate 100, e.g., may be buried within the substrate such that an uppermost surface of the substrate 100 is at a level higher than lowermost surfaces of the gate line structures GL. However, embodiments are not be limited thereto, e.g., no portion of the gate line structures GL or the entire gate line structures GL may be buried in the substrate 100.

The substrate 100 may be formed to have first trenches 105 and the gate line structures GL may be disposed in the first trenches 105. The gate line structures GL may extend along a direction (e.g., y direction) crossing the device isolation layer 101. Each of the gate line structures GL may include a conductive line 121 provided in the first trenches 105, a first insulating layer 110 surrounding side and bottom surfaces of the conductive line 121, and a first capping pattern 129 provided on the conductive line 121 to fill the remaining space of the first trenches 105. Each of the first insulating layers 110 may serve as a gate insulating layer of the transistor. The first insulating layers 110 and the first capping patterns 129 may separate the conductive lines 121 electrically from the substrate 100, e.g., the conductive lines 121 may be completely spaced apart from the substrate 100 by the first insulating layers 110 and the first capping patterns 129. A top surface of the conductive line 121 may be positioned at a same level or a level lower than a top surface of the substrate 100.

The conductive lines 121 may include a conductive material. For example, the conductive lines 121 may include a doped semiconductor, conductive metal nitrides, metals, and/or metal-semiconductor compounds. The first insulating layers 110 may include a silicon oxide, a silicon nitride, and/or a silicon oxynitride. The first capping patterns 129 may include a silicon nitride, a silicon oxide, and/or a silicon oxynitride. In some embodiments, the gate line structures GL may serve as word lines of the data storing device.

Second source/drain regions SD2 may be provided in the substrate 100 between the gate line structures GL, and source lines SL may be provided on the second source/drain regions SD2. Due to the presence of the device isolation layer 101, the second source/drain regions SD2 may be separated from each other in the y direction. The source lines SL may connect the second source/drain regions SD2 arranged along the y direction. For example, the second source/drain regions SD2 spaced apart from each other in the y direction may be connected to each other by the respective one of the source lines SL. The source lines SL may be formed in and/or through a first interlayer dielectric layer 117 covering the second source/drain regions SD2 and extend along the y direction substantially parallel to the gate line structures GL. In this sense, each of the source lines SL may serve as a common source line. Furthermore, the second source/drain regions SD2 may be electrically connected to the source lines SL, such that each of the second source/drain regions SD2 may serve as a common source region of the transistors disposed adjacent thereto. Second metal-silicide layers 182 may be provided between the source lines SL and the second source/drain regions SD2. The presence of the second metal-silicide layer 182 may reduce a contact resistance between the source lines SL and the second source/drain regions SD2.

A bottom surface of the source lines SL may be positioned at a level lower than a top surface of the substrate 100. For example, the bottom surface of the source lines SL may be positioned at a level lower than a top surface of the first capping patterns 129. In some embodiments, at least one of the source lines SL may be partially overlapped with the first capping patterns 129 disposed adjacent thereto. The top surface of the source lines SL may be positioned at a level higher than a top surface of the gate line structure GL.

The second source/drain regions SD2 may be a heavily doped region having a different conductivity type from the substrate 100. For example, in the case that the substrate 100 is p-type, the second source/drain regions SD2 may be n-type. The source lines SL may include metals, conductive metal nitrides, and/or metal-semiconductor compounds. For example, the source lines SL may include at least one of tungsten, titanium, and/or tantalum. In other embodiments, the source lines SL may be a doped semiconductor layer.

The source lines SL may be electrically connected with each other. In some embodiments, a source connecting line CSL may be provided to electrically connect the source lines SL with each other. The source connecting line CSL may extend along a direction crossing the gate line structures GL, e.g., parallel to the device isolation layers 101. The source connecting line CSL may be formed along with the source lines SL, such that the source connecting line CSL and the source lines SL may be disposed on the substantially same plane, e.g., in a same layer of the device so that source connecting line CSL is directly connected to the source lines SL without any separate contact plug. The source connecting line CSL may extend laterally from the cell array region CAR onto the peripheral circuit region PCR. The source connecting line CSL may be electrically connected to a transistor (not shown) on the peripheral circuit region PCR via a third contact plug 148.

The source connecting line CSL may be disposed at a side, e.g., a lateral end, of the source lines SL as shown in FIG. 1. However, embodiments are not limited thereto. For example, the source connecting line CSL may be configured to have one of other structures capable of connecting the source lines SL electrically with each other. In some embodiments, the source connecting line CSL may be disposed at both sides of the source lines SL. In other embodiments, the source connecting line CSL may be disposed around the cell array region CAR to have a closed loop shape.

Conductive isolation patterns CI may be provided to define active regions of the transistors. The conductive isolation patterns CI may have a shape and composition similar to or same as the gate line structures GL. For example, the conductive isolation patterns CI and the gate line structures GL may be simultaneously formed during the same process stages. In some embodiments, at least portions of the conductive isolation patterns CI may be inserted or buried in the substrate 100. In plan view, each of the source lines SL may extend between adjacent pairs of the conductive isolation patterns CI, respectively, and the gate line structures GL may be extend between the source lines SL and the conductive isolation patterns CI. In some embodiments, the conductive isolation patterns CI may be provided in second trenches 106 formed in the substrate 100. The second trenches 106 may be formed substantially parallel to the first trenches 105. In some embodiments, the first and second trenches 105 and 106 may be formed using the same etching process. As a result, the second trenches 106 may be formed to have the substantially same depth and same width as the first trenches 105.

The conductive isolation patterns CI may be formed to have the substantially same shape as the gate line structures GL. For example, each the conductive isolation patterns CI may include the conductive line 121, the first insulating layer 110 surrounding sides and bottom surfaces of the conductive line 121, and the first capping pattern 129 provided on the conductive line 121 to fill the second trenches 106, similar to the gate line structures GL.

The conductive isolation patterns CI may be electrically connected with each other. In some embodiments, a conductive connecting pattern GS may be provided to electrically connect the conductive isolation patterns CI with each other. The conductive isolation patterns CI may be electrically connected to the conductive connecting pattern GS via first contact plugs 147.

The conductive connecting pattern GS may extend along a direction crossing the gate line structures GL, e.g., parallel to the device isolation layers 101. The conductive connecting pattern GS may extend laterally from the cell array region CAR to be disposed on the peripheral circuit region PCR. The conductive connecting pattern GS and the first contact plugs 147 may include metals, conductive metal nitrides, metal-semiconductor compounds, and/or doped semiconductors. The conductive connecting pattern GS may be disposed at a side, e.g., lateral ends, of the conductive isolation patterns CI as shown in FIG. 1. However, embodiments are not limited thereto, e.g., the conductive connecting pattern GS may be configured to have one of structures capable of connecting the conductive isolation patterns CI electrically with each other. In some embodiments, the conductive connecting pattern GS may be disposed at both sides of the conductive isolation patterns CI. In other embodiments, the conductive connecting pattern GS may be disposed around the cell array region CAR to have a closed loop shape.

First source/drain regions SD1 may be provided between the gate line structures GL and the conductive isolation patterns CI. The first source/drain regions SD1 may be spaced apart from the second source/drain regions SD2 by the gate line structures GL. The first source/drain regions SD1 may be impurity regions that are heavily doped with impurities having a different conductivity type from the substrate 100. The first source/drain regions SD1 may be spaced apart from each other, in y-direction, by the device isolation layer 101. In some embodiments, the first source/drain regions SD1 may serve as drain regions of the transistors controlled by the gate line structures GL.

In the case in which a voltage higher than a threshold voltage is applied to the gate line structures GL, channels (not shown) may be formed under the gate line structures GL to electrically connect the first source/drain regions SD 1 with the second source/drain regions SD2. The channel may be formed along a surface of the substrate 100 facing side and bottom surfaces of each gate line structure GL. Accordingly, a length of the channel may be elongated, compared with the case that the gate structure is formed on a top surface of the substrate 100. This elongation in channel length may relieve a short channel effect that may occur in a data storing device with an increased integration density.

A peripheral gate electrode structure PG may be provided on the peripheral circuit region PCR. The peripheral gate electrode structure PG may include a gate insulating layer 131, a gate electrode, and a second capping pattern 134, which are sequentially stacked on each other in the peripheral circuit region PCR. The gate electrode may include a plurality of layers. For example, the gate electrode may include a first gate electrode 132 including a semiconductor material and a second gate electrode 133 including a metallic material. The peripheral gate electrode structure PG may further include first spacers 136 disposed on sidewalls of the first and gate electrodes 132 and 133. The first spacer 136 and the second capping pattern 134 may be formed of a silicon nitride, a silicon oxide, or a silicon oxynitride.

Upper conductive patterns may be provided on the gate line structures GL. In some embodiments, the upper conductive patterns may serve as bit lines BL. The bit lines BL may be electrically connected to the first source/drain regions SD1 via lower contact plugs 144 penetrating first and second interlayer dielectric layers 117 and 118. In some embodiments, a first metal silicide layer 181 may be provided between the lower contact plugs 144 and the first source/drain regions SD1, e.g., at least a portion of the first metal silicide layer 181 may be buried in the first source/drain regions SD1. The bit lines BL may extend laterally on the peripheral circuit region PCR and be electrically connected to third source/drain regions 135 disposed on the peripheral circuit region PCR via first and second peripheral contact plugs 142 and 143.

In an example of this embodiment as applied to a variable resistance memory device, variable resistance structures VR may be provided between the bit lines BL and the lower contact plugs 144, respectively. Each of the bit lines BL may extend along x direction and be electrically connected to a plurality of variable resistance structures VR. The variable resistance structures VR may be provided in a third interlayer dielectric layer 119, e.g., which may be stacked on the first and second interlayer dielectric layers 117 and 118. However, exemplary embodiments may not be limited to forming the variable resistance memory device, i.e., using variable resistance structures for data storage. For example, one of ordinary skill in the art could modify the exemplary embodiments to form another type of memory device.

Nevertheless, the description that follows will refer to an example of the present embodiment in which the variable resistance structures VR are used as a memory element of a data storing device. The variable resistance structures VR may be provided between the bit lines BL and the lower contact plugs 144, and data stored therein may be dependent on their resistance. In some embodiments, the variable resistance memory device may be a magnetic random access memory device (MRAM), in which a magnetic tunnel junction (MTJ) is used as the variable resistance structures VR, but embodiments are not limited thereto. For example, the data storing device may be a phase changeable memory device (or PRAM), a ferroelectric memory device (or FRAM), or a resistive memory device (or RRAM). In an example of this embodiment as applied to the PRAM, the variable resistance structures VR may include a phase changeable material interposed between electrodes. In an example of this embodiment as applied to the FRAM, the variable resistance structures VR may include a ferroelectric layer interposed between electrodes. Hereinafter, for the sake of simplicity, the description that follows will refer to an example including the MTJ. However, as discussed above, embodiments are not limited thereto.

Each of the variable resistance structures VR may include a reference magnetic layer 12, a tunnel barrier layer 13, and a free layer 14, which may be sequentially stacked between a first electrode 11 and a second electrode 15. The reference magnetic layer 12 and the free layer 14 may be interchangeable in terms of vertical position. In addition, each of the variable resistance structures VR may be configured to include one or more reference magnetic layers and/or one or more free layers. For example, a plurality of magnetic tunnel junctions (MTJs) may be provided between the first and second electrodes 11 and 12. Electric resistance of each MTJ may vary depending on whether magnetizations of the reference magnetic layer 12 and the free layer 14 are parallel. In other words, electric resistance of the MTJ may be higher, when magnetizations of the reference magnetic layer 12 and the free layer 14 are anti-parallel, than when parallel. This difference in electric resistance may be used to write and/or read out data of the magnetic memory device.

Each of the first and second electrodes 11 and 15 may include a conductive material having a low reactivity. For example, the first and second electrodes 11 and 15 may be formed of conductive metal nitrides. In some embodiments, at least one of the first and second electrodes 11 and 15 may include a titanium nitride, a tantalum nitride, a tungsten nitride, and/or a titanium aluminum nitride.

In operation of the device, for the case of a horizontal-type MTJ in which an operating current flows along a direction perpendicular to its easy axis, the reference magnetic layer 12 may include a pinning layer and a pinned layer. The pinning layer may include an anti-ferromagnetic material. For example, the pinning layer may include PtMn, IrMn, MnO, MnS, MnTe, $MnF_2$, $FeCl_2$, FeO, $CoCl_2$, CoO, $NiCl_2$, NiO, and/or Cr. In this case, a magnetization direction of the pinned layer may be fastened by the pinning layer. The pinned layer may include a ferromagnetic material. For example, the pinned layer may include CoFeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

The tunnel barrier layer 13 may be formed to a thickness smaller than a spin diffusion distance. The tunnel barrier layer 13 may include a nonmagnetic material. For example, the tunnel barrier layer 13 may include a magnesium oxide, a titanium oxide, an aluminum oxide, a magnesium-zinc oxide and a magnesium-boron oxide, a titanium nitride, and/or a vanadium nitride.

The free layer 14 may include a material exhibiting a switchable magnetization direction. For example, a magnetization direction of the free layer 14 may be changed by an internal or external electromagnetic effect. In some embodiments, the free layer 14 may include a ferromagnetic material containing, for example, at least one of cobalt, iron or nickel. For example, the free layer 14 may include FeB, Fe, Co, Ni, Gd, Dy, CoFe, NiFe, MnAs, MnBi, MnSb, $CrO_2$, $MnOFe_2O_3$, $FeOFe_2O_3$, $NiOFe_2O_3$, $CuOFe_2O_3$, $MgOFe_2O_3$, EuO, and/or $Y_3Fe_5O_{12}$.

Embodiments for the variable resistance memory device including the horizontal-type MTJ may not be limited thereto. For example, the variable resistance memory device may include a perpendicular-type MTJ in which an operating current flows along a direction substantially parallel to its easy axis. In this case, magnetization directions of the reference magnetic layer 12 and the free layer 14 may be substantially parallel to a normal of the tunnel barrier layer 13.

In an example of this embodiment as applied to the variable resistance memory device, operations of reading a datum, writing a datum '1', and writing a datum '0' may be performed based on the conditions given by the following Table 1. Here, the afore-described gate line structure GL may correspond to a word line WL.

TABLE 1

|  | WL (GL) | | BL | | | |
| --- | --- | --- | --- | --- | --- | --- |
|  | Sel-WL | Unsel-WL | Sel-BL | Unsel-BL | CI | SL |
| Writing of datum '1' | Vg1 | GND or negative | Vd1 | GND or floating | GND or negative | Vsl (1 V or GND) |
| Writing of datum '0' | Vg0 | GND or negative | Vd0 | GND or floating | GND or negative | Vsl (1 V or GND) |
| Reading | Vgr | GND or negative | Vr | GND or floating | GND or negative | Vsl (1 V or GND) |

From Table 1, operations of writing a datum '1', writing a datum '0' and reading a datum may be performed under conditions of applying voltages of Vg1, Vg0, and Vgr, respectively, to the selected word line Sel-WL. The voltages of Vg1, Vg0, and Vgr may be higher than a threshold voltage of the corresponding transistor and may be adjusted in consideration for a material of the variable resistance structures VR, a doping concentration of source/drain regions, a thickness of a gate insulating layer, and/or so forth. In some embodiments, the voltage Vg1 may be substantially equivalent to the voltage Vg0, and the voltage Vgr may be relatively lower than the voltages Vg1 and Vg0. For example, the voltages Vg1 and Vg0 may be in the range of about 0.5 to about 5V. The unselected word line Unsel-WL may be applied with a ground voltage GND or a negative voltage, during the operations.

In the writing and reading operations, the source lines SL may be applied with a voltage Vsl. In some embodiments, the voltage Vsl may be about 1V or a ground voltage GND. The operations of writing a datum '1', writing a datum '0' and reading a datum may be performed under conditions of applying voltages of Vd1, Vd0, and Vr, respectively, to a selected bit line Sel-BL. The voltage Vd1 may be higher than the voltage Vd0. In other embodiments, the voltage Vd1 may be equivalent to or higher than the voltage Vd0, depending on a material used for the variable resistance structures VR. An unselected bit line Unsel-BL may be applied with a ground voltage GND or be in an electrically floating state.

In the writing and reading operations, the conductive isolation patterns CI may be applied with a ground voltage GND or a negative voltage. For example, the conductive isolation patterns CI may be applied with the substantially same voltage as that applied to the unselected word line Unsel-WL. In other embodiments, the conductive isolation patterns CI may be applied with a voltage less than that applied to the unselected word line Unsel-WL.

In the case in which the conductive isolation pattern CI is applied with a ground voltage GND or a negative voltage, it is possible to prevent a potential of the conductive isolation pattern CI from being boosted by a voltage applied to the gate line structures GL adjacent thereto and therefore, e.g., to reduce the possibility of and/or prevent a channel from being formed under the corresponding conductive isolation pattern CI. As will be described below, the conductive isolation patterns CI may be formed by at least partially using a process for forming the gate line structures GL. As a result, the gate line structures GL may be electrically isolated with ease and simplicity. In addition, the ground or negative voltage can be simultaneously applied to a plurality of the conductive isolation patterns CI using the conductive connecting pattern GS.

In some embodiments, the gate line structures GL buried in the substrate 100 may prevent the short channel effect. Furthermore, adjacent ones of the gate line structures GL may share a source region via the source lines SL such that the device can have an increased integration density. In addition, the conductive isolation patterns CI may be formed by at least partially using a process for forming the gate line structures GL, and thus, an insulation structure between the gate line structures GL can be formed with ease and simplicity.

Figure 3:
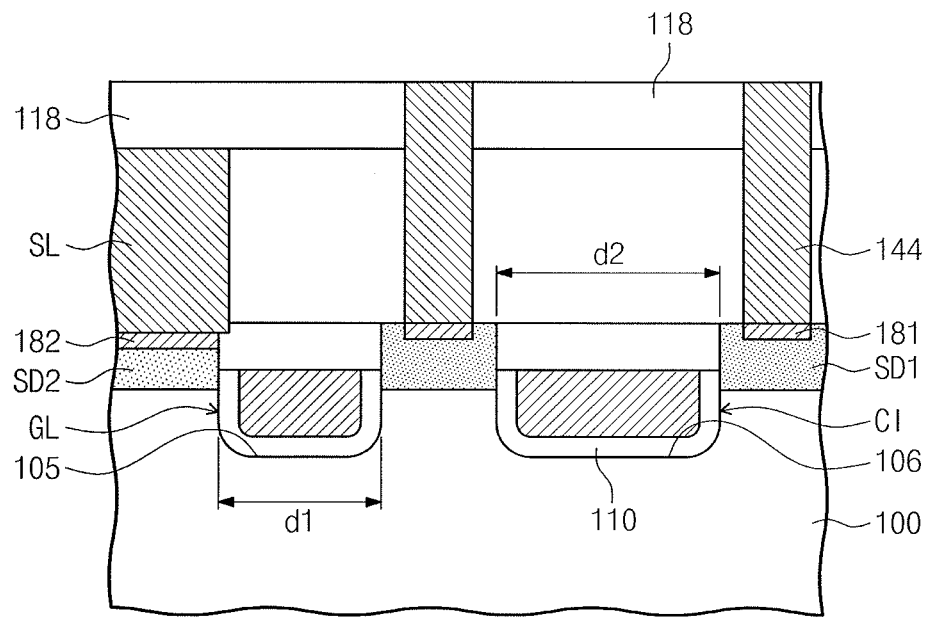
FIGS. 3 and 4 illustrate enlarged sectional views of data storing devices according to modified exemplary embodiments.
Figure 4:
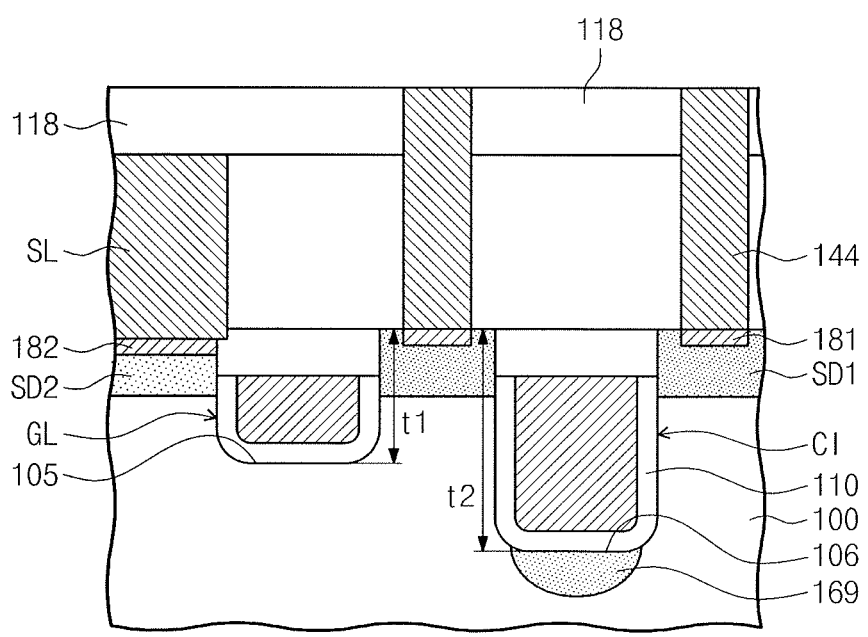

FIGS. 3 and 4 shows data storing devices according to modifications of the first embodiment, and are sectional views enlarging a portion of FIG. 2A. As shown in FIG. 3, a width d2 of the conductive isolation pattern CI may be greater than a width d1 of the gate line structure GL. In other embodiments, e.g., as shown in FIG. 4, a thickness t2 of the conductive isolation pattern CI may be greater than a thickness t1 of the gate line structure G1. These modifications related to the conductive isolation patterns CI may be achieved by changing shapes of the first and/or second trenches 105 and/or 106. For example, the structure shown in FIG. 3 may be obtained by patterning the second trenches 106 to have a width greater than a width of the first trenches 105. The structure of FIG. 4, in which the first trenches 105 is formed to have a different depth from that of the second trenches 106, may be obtained by separately etching the first and second trenches 105 and 106.

Referring to FIG. 4, a channel stop region 169 may be formed in the substrate 100 below the conductive isolation patterns CI. The channel stop region 169 may electrically isolate adjacent source/drain regions SD1 from each other. The channel stop region 169 may be formed by injecting impurities with the same conductivity type as the substrate 100 into the substrate 100 under the second trenches 106. As such, the channel stop region 169 may have a higher impurity concentration that the substrate 100. For example, the formation of the structure shown in FIG. 4 may include forming the first trenches 105, forming a mask (not shown) covering the first trenches 105, forming the second trenches 106 in the substrate 100 exposed by the mask, and performing an ion implantation process to locally form the channel stop regions 169 at bottoms of the second trenches 106 before forming the conductive isolation patterns CI.

FIGS. 5A through 12A and 5B through 12B illustrate sectional views depicting stages in methods of fabricating a data storing device according to exemplary embodiments. In more detail, FIG. 5A through FIG. 12A illustrate sectional views taken along lines A-A' and B-B' of FIG. 1 and FIGS. 5B through 12B illustrate sectional views taken along lines C-C' and D-D' of FIG. 1.

Figure 5A:
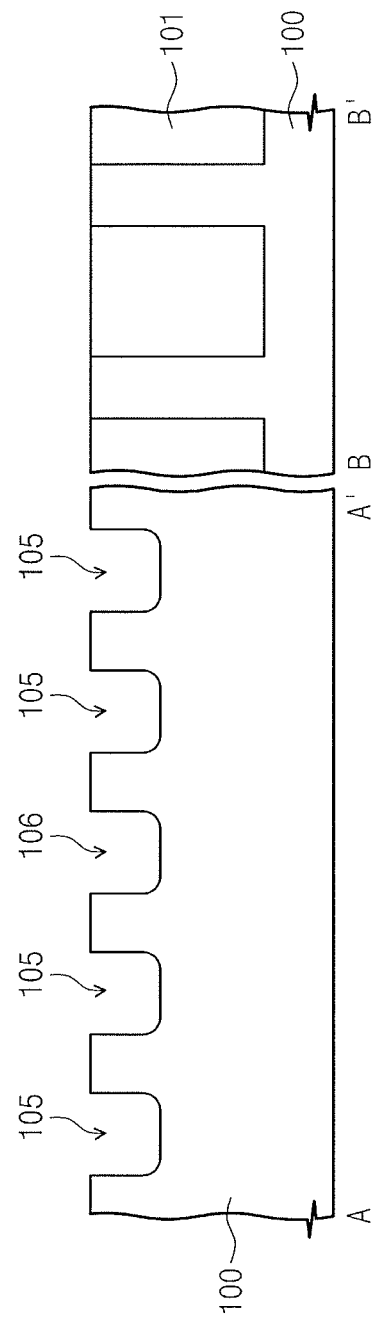
Figure 5B:
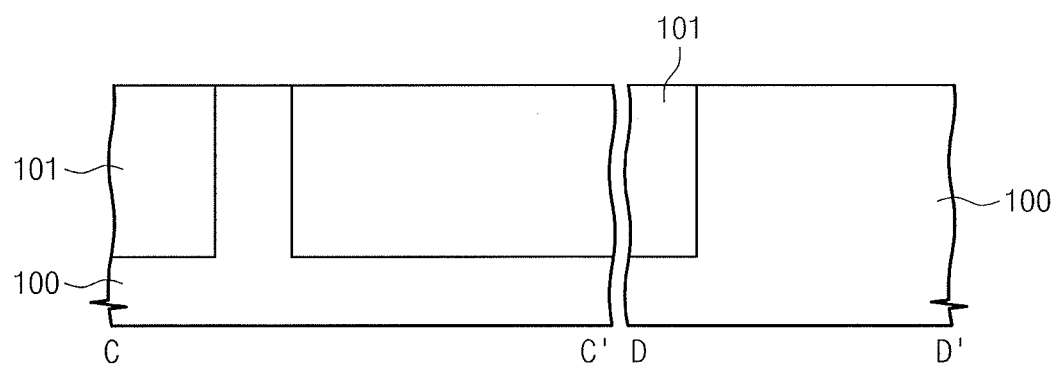

Referring to FIGS. 1, 5A and 5B, a device isolation layer 101 may be formed in a substrate 100 to define a first active region AR1 in a cell array region CAR and a second active region AR2 in a peripheral circuit region PCR. The first active region AR1 and the device isolation layer 101 may be formed to have a rectangular shape extending along a direction, e.g., an x direction. The device isolation layer 101 may be formed using a trench isolation technique. The device isolation layer 101 may be formed of, e.g., a borosilicate glass (BSG), a phosphosilicate glass (PSG), a boro-phosphosilicate glass (BPSG), a tetra ethly ortho silicate (TEOS), an undoped silicate glass (USG), a high density plasma (HDP) material, and/or a spin-on-glass (SOG) material. The substrate 100 may include a doped region that is lightly doped with p-type impurities.

Trenches extending along another direction, e.g., the y direction, may be formed in the cell array region CAR. The trenches may include first trenches 105 and second trenches 106. As afore-described, the first trenches 105 may correspond to a region for disposing a gate line structure, the second trenches 106 may correspond to a region for disposing a conductive isolation pattern. In some embodiments, the first and second trenches 105 and 106 may be formed to have the substantially a same depth and a same width. In other embodiments, the first and second trenches 105 and 106 may be formed to have different depths or different widths from each other as described with reference to FIGS. 3 and 4. Hereinafter, the description that follows will refer to an example in which the first and second trenches 105 and 106 are formed using the same etching process and have the same depth. The first and second trenches 105 and 106 may be patterned using a hard mask pattern or a photoresist pattern, and the hard mask pattern or the photoresist pattern may be removed after the formation of the first and second trenches 105 and 106.

Figure 6A:
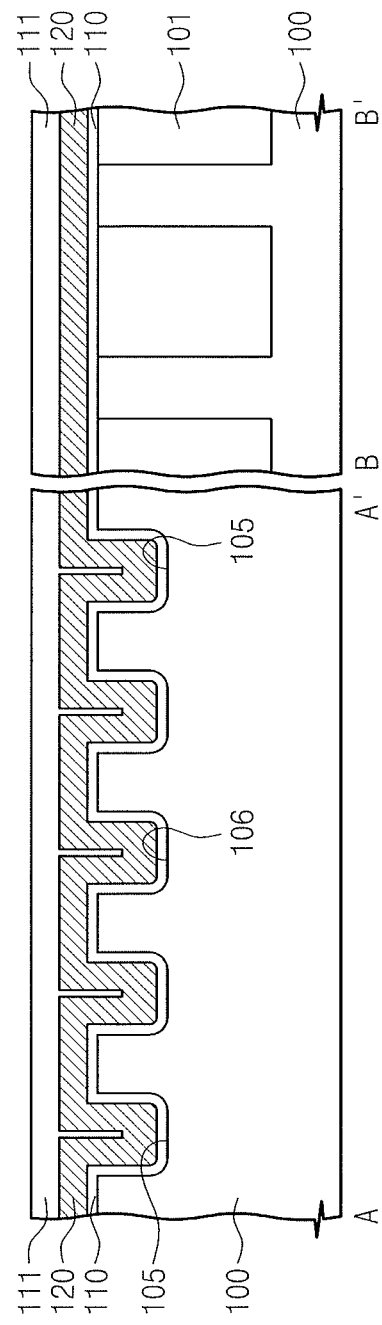
Figure 6B:
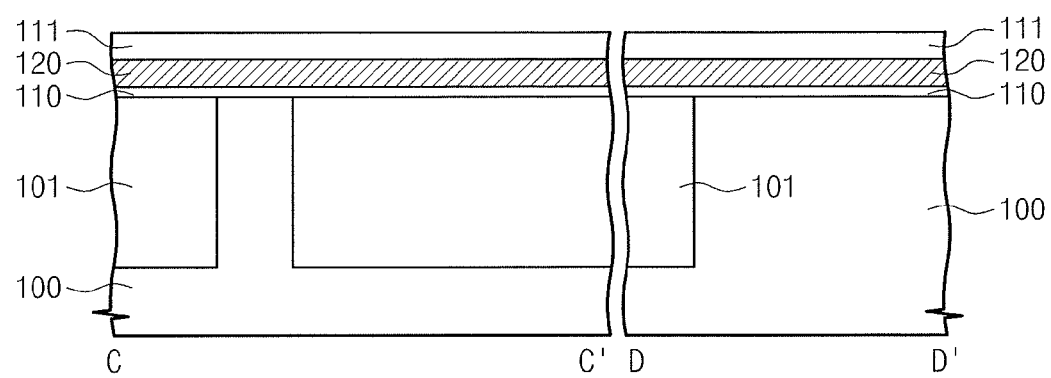

Referring to FIGS. 1, 6A and 6B, a first insulating layer 110, a first conductive layer 120, and a gap-filling layer 111 may be sequentially formed on the substrate 100 provided with the first and second trenches 105 and 106. In some embodiments, the first insulating layer 110 and the first conductive layer 120 may be formed to conformally cover inner surfaces of the first and second trenches 105 and 106, and the gap-filling layer 111 may be formed to fill the remaining spaces of the first and second trenches 105 and 106. The first insulating layer 110 may include at least one of a silicon oxide, a silicon nitride, and/or a silicon oxynitride. The first conductive layer 120 may include at least one of a doped semiconductor, conductive metal nitrides, metals, and/or metal-semiconductor compounds. The gap-filling layer 111 may include at least one of a silicon oxide, a silicon nitride, and/or a silicon oxynitride. The first insulating layer 110, the first conductive layer 120, and the gap-filling layer 111 may be formed using at least one of chemical vapor deposition (CVD), physical vapor deposition (PVD), and/or atomic layer deposition (ALD).

Figure 7B:
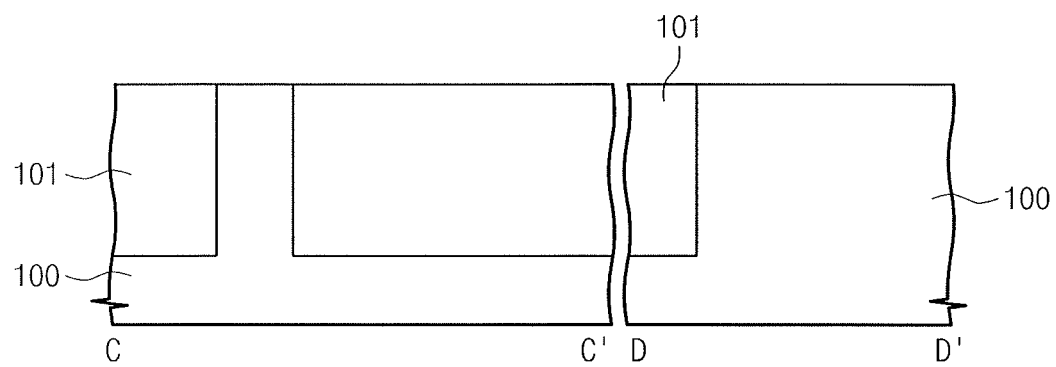

Referring to FIGS. 1, 7A, and 7B, the first insulating layer 110, the gap-filling layer 111 and the first conductive layer 120 may be etched to expose a top surface of the substrate 100. As the result of the etching process, the first conductive layer 120 may be separated into a plurality of conductive lines 121 that are confined within each of the first and second trenches 105 and 106. In some embodiments, a planarization process may be performed, before the etching process, to make top surfaces of the gap-filling layer 111 and the first conductive layer 120 coplanar. The etching process may be performed using an etch recipe selected to etch the first conductive layer 120 and the gap-filling layer 111 with the substantially same etching rate. Due to the presence of the gap-filling layer 111, it is possible to prevent the conductive lines 121 in the first and second trenches 105 and 106 from being damaged. The etching process may be performed to expose upper sidewalls of the first and second trenches 105 and 106.

As a result, unoccupied recess regions may be formed in upper portions of the first and second trenches 105 and 106. The first insulating layer 110, the first conductive layer 120, and the gap-filling layer 111 may be removed from the peripheral circuit region PCR during the etching process.

Figure 8B:
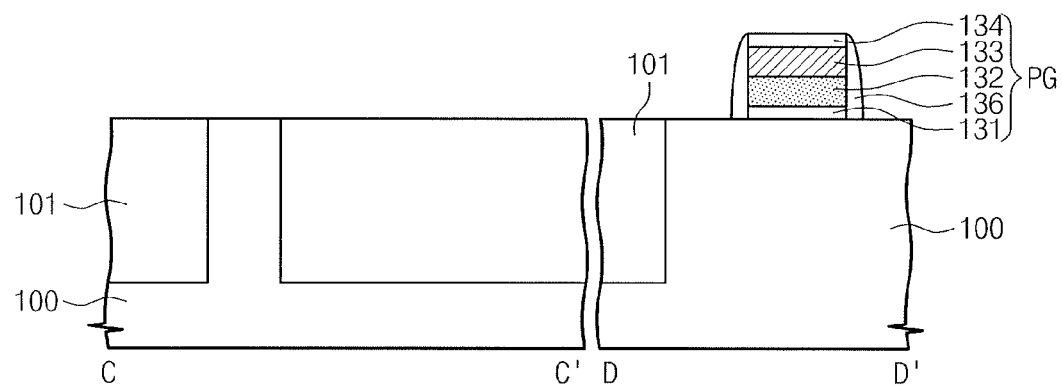

Referring to FIGS. 1, 8A, and 8B, first capping patterns 129 may be formed to fill the upper portions of the first and second trenches 105 and 106. The formation of the first capping patterns 129 may include forming an insulating layer to fill the unoccupied recess regions formed in the upper portions of the first and second trenches 105 and 106, and then performing a planarization process to expose the top surface of the substrate 100. The first capping patterns 129 may include at least one of a silicon nitride, a silicon oxide, and/or a silicon oxynitride. As the result of the formation of the first capping patterns 129, gate line patterns GL may be formed in the first trenches 105 and conductive isolation patterns CI may be formed in the second trenches 106. In some embodiments, a pair of the gate line patterns GL may be formed between adjacent ones of the conductive isolation patterns CI.

A peripheral gate electrode structure PG may be formed on the peripheral circuit region PCR. In some embodiments, the peripheral gate electrode structure PG may include a gate insulating layer 131, a gate electrode, and a second capping pattern 134 sequentially stacked on the peripheral circuit region PCR. The gate electrode may include a plurality of layers. For example, the gate electrode may include a first gate electrode 132 including a semiconductor material and a second gate electrode 133 including a metallic material. The peripheral gate electrode structure PG may be formed to further include first spacers 136 disposed on sidewalls of the first and gate electrodes 132 and 133. In some embodiments, the gate insulating layer 131 may be formed of a silicon oxide, and the second capping pattern 134 may be formed of a silicon nitride. The formation of the peripheral gate electrode structure PG may include removing the gate insulating layer 131, the gate electrodes 132 and 133, and the second capping pattern 134 from the cell array region CAR, e.g., patterning the substrate 100 so that the electrode structure PG is only formed in the peripheral circuit region PCR.

Figure 9B:
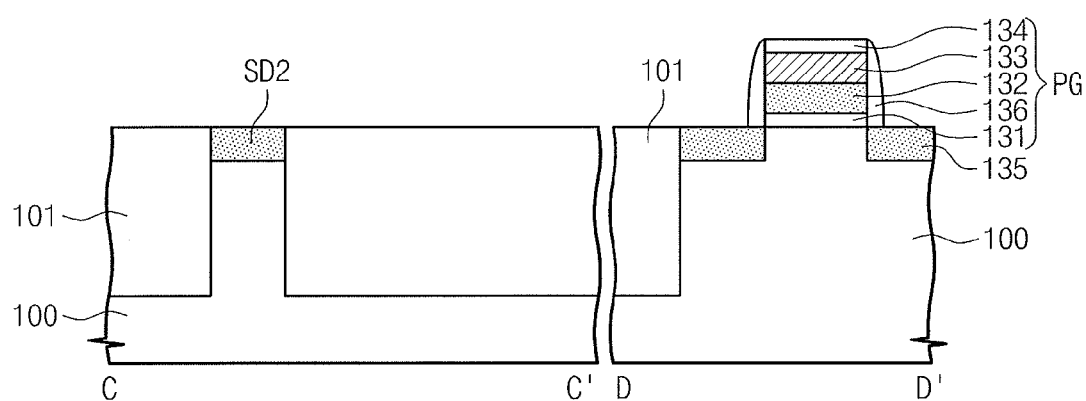

Referring to FIGS. 1, 9A, and 9B, source/drain regions may be formed in the substrate 100. The source/drain regions may include first source/drain regions SD1 and second source drain regions SD2, which are formed in the cell array region CAR, and third source/drain regions 135 formed in the peripheral circuit region PCR. The first source/drain regions SD1 may be formed in the substrate 100 between the gate line structures GL and the conductive isolation patterns CI, and the second source/drain regions SD2 may be formed between the gate line structures GL. The third source/drain region 135 may be formed by an ion implantation process using the peripheral gate electrode structure PG as an ion mask.

In some embodiments, the first, second, and third source/drain regions SD1, SD2, and 135 may be formed by injecting impurities with a different conductivity type from the substrate 100 into the substrate 100. In some embodiments, the first to third source/drain regions SD1, SD2, and 135 may be simultaneously formed using the same process. In other embodiments, at least one of the first to third source/drain regions SD1, SD2, and 135 may be formed using another ion implantation process. Hereinafter, the description that follows will refer to an example in which the first to third source/drain regions SD1, SD2, and 135 are simultaneously formed. However, embodiments may not be limited thereto.

Figure 10A:
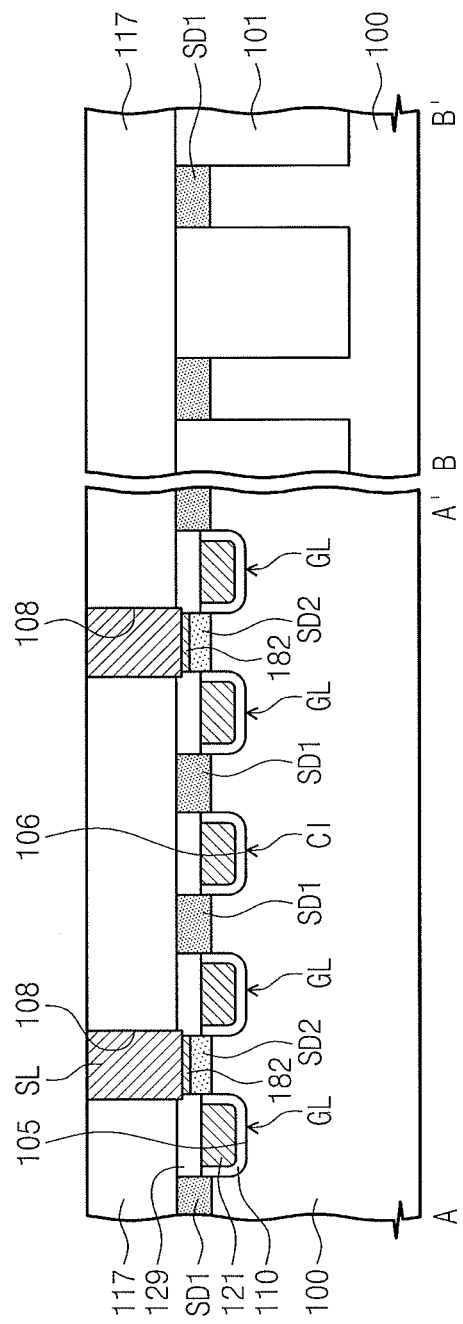
Figure 10B:
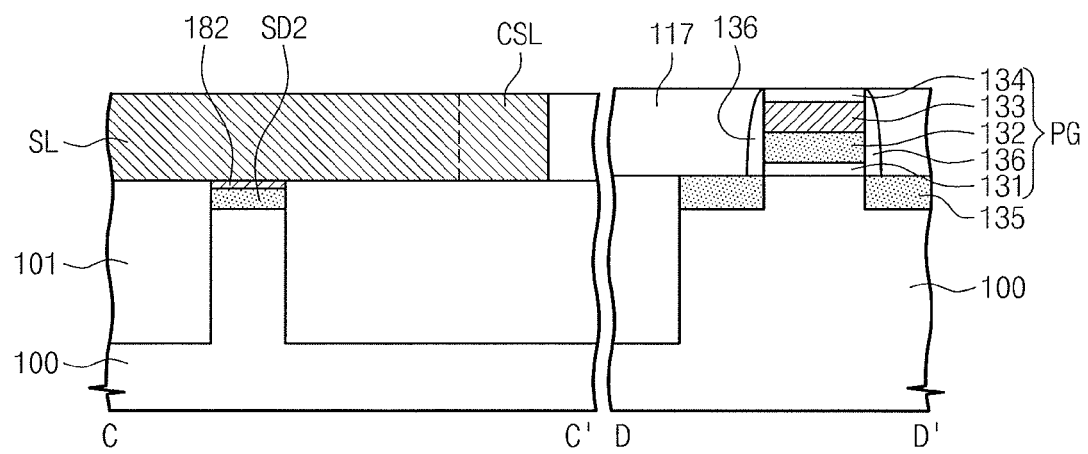

Referring to FIGS. 1, 10A, and 10B, source lines SL may be formed and may be connected to the second source/drain regions SD2. The source lines SL may be spaced apart from the first source/drain regions SD1, e.g., electrically isolated and/or not electrically connected to the first source/drain regions SD 1. The formation of the source lines SL may include forming a first interlayer dielectric layer 117 on the substrate 100, patterning the first interlayer dielectric layer 117 to form first recess regions 108 that overlap the second source/drain regions SD2, and forming a conductive layer to fill the first recess regions 108. Thereafter, a planarization process may be performed on the conductive layer to expose the first interlayer dielectric layer 117, thereby forming the source lines SL within the first recess regions 108. The first recess regions 108 may be formed to extend along the y direction and parallel to the gate line structures GL, e.g., to be connected to a plurality of adjacent second source/drain regions SD2.

The source lines SL may include at least one of metals, conductive metal nitrides, metal-semiconductor compounds, and/or doped semiconductors. Before the formation of the source lines SL, a second metal-silicide layer 182 may be formed on the substrate 100 exposed by the first recess regions 108, e.g., on exposed portions of the second source/drain region SD2. The formation of the second metal-silicide layer 182 may include depositing a metal layer on the substrate 100 exposed by the first recess regions 108 and then thermally treating the structure provided with the metal layer.

In some embodiments, a source connecting line CSL may be formed along with the source lines SL. For example, portions of the first recess regions 108 may extend along the x direction, and the source connecting line CSL connected to the source lines SL may be formed in the first recess regions 108. The source connecting line CSL may extend along the x direction to connect end portions of the source lines SL at one side of the cell array region CAR. In some embodiments, the source connecting line CSL may extend on the peripheral circuit region PCR. As described above, the source connecting line CSL may be variously modified to have one of shapes capable of connecting the source lines SL with each other, and embodiments may not be limited to that depicted in the drawings.

Figure 11A:
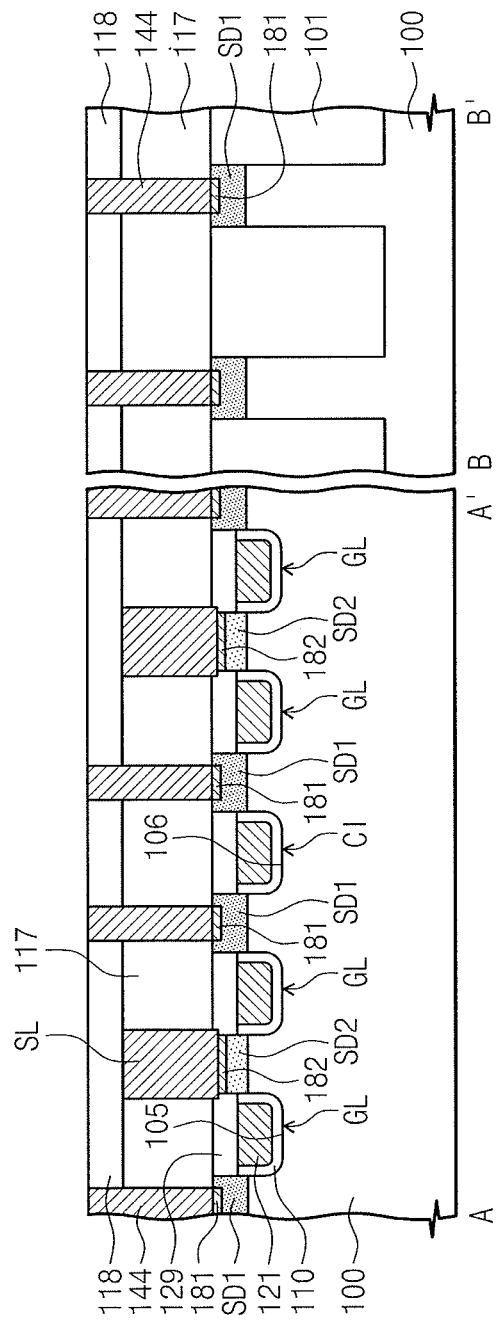
Figure 11B:
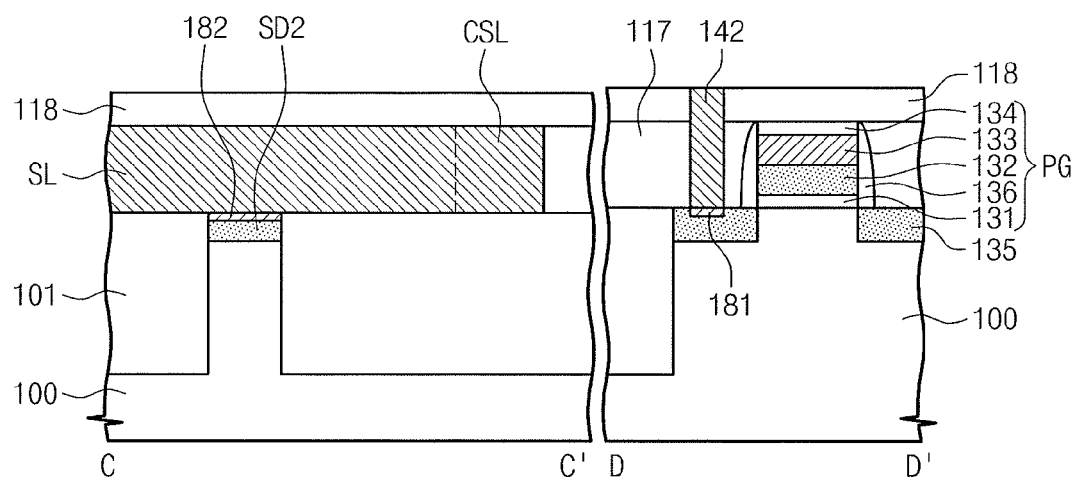

Referring to FIGS. 1, 11A, and 11B, lower contact plugs 144 may be formed to be in contact with the first source/drain regions SD1. The formation of the lower contact plugs 144 may include forming a second interlayer dielectric layer 118 on the first interlayer dielectric layer 117, and forming contact holes to penetrate the first and second interlayer dielectric layers 117 and 118. The lower contact plugs 144 may be formed of metals, conductive metal nitrides, metal-semiconductor compounds, and/or doped semiconductors.

First peripheral contact plugs 142 may be electrically connected to the third source/drain region 135. In some embodiments, the first peripheral contact plugs 142 may be formed using the process for forming the lower contact plugs 144. However, embodiments may not be limited thereto, e.g., the first peripheral contact plugs 142 and the lower contact plugs 144 may be formed using separate processes. First metal-silicide layers 181 may be formed between the contact plugs 142 and 144 and the first and third source/drain regions SD1 and 135. The first metal-silicide layers 181 may be formed using the same method, e.g., at a same time, as that for forming the second metal-silicide layer 182.

Figure 12A:
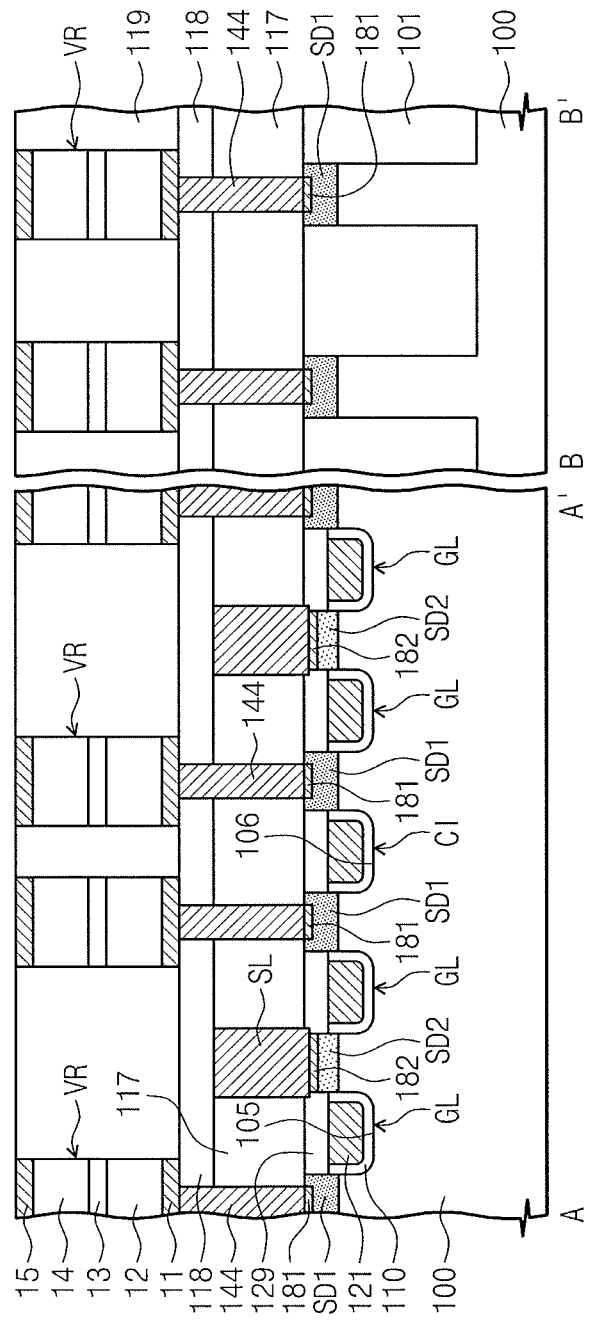
Figure 12B:
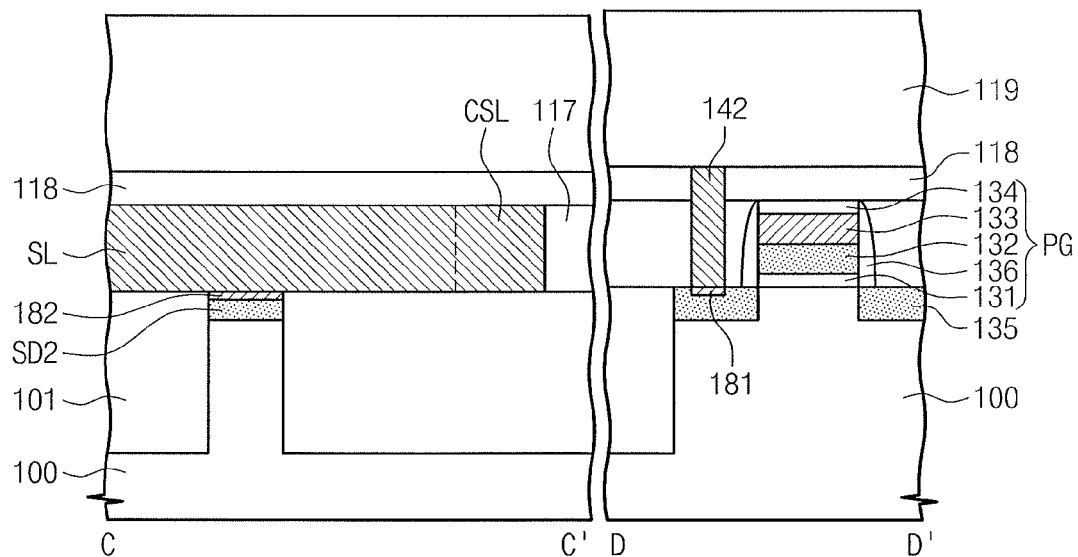

Referring to FIGS. 1, 12A, and 12B, variable resistance structures VR may be formed on the first source/drain regions SD1. The variable resistance structures VR may be electrically connected to the first source/drain regions SD 1 via the lower contact plugs 144. The variable resistance structures VR may be formed within a third interlayer dielectric layer 119.

In an exemplary of this embodiment, e.g., as applied to the fabrication of a magnetic memory device, the variable resistance structures VR may be formed to include a MTJ. For example, the formation of the variable resistance structures VR may include sequentially forming a first electrode 11, a reference magnetic layer 12, a tunnel barrier layer 13, a free layer 14, and a second electrode 15 on the lower contact plugs 144, and patterning the resultant stacked structure to form the variable resistance structures VR disposed on the lower contact plugs 144, respectively.

The patterning process may include a plurality of etching steps. For example, the second electrode 15 may be used as a mask for patterning layers disposed thereunder (e.g., the free layer 14, the tunnel barrier layer 13, and the reference magnetic layer 12). After the formation of the variable resistance structures VR, the third interlayer dielectric layer 119 may be formed by depositing an insulating layer to fill a space between the variable resistance structures VR. Portions of the third interlayer dielectric layer 119 on upper surfaces of the variable resistance structures VR may be removed so that the upper surfaces are exposed.

Referring back to FIGS. 1 and 2A through 2C, bit lines BL may be formed to cross the gate line structures GL and connect the variable resistance structures VR with each other. In some embodiments, the bit lines BL may be formed to be in contact with, e.g., directly on, the second electrodes 15.

A second peripheral contact plug 143 extending through the third interlayer dielectric layer 119 may be formed to be in contact with the first peripheral contact plug 142. The second peripheral contact plug 143 may be formed before the formation of the bit lines BL. The second peripheral contact plug 143 may be formed in a contact hole that is provided on the peripheral circuit region PCR to penetrate the third interlayer dielectric layer 119 and expose the second peripheral contact plug 142. In some embodiments, the bit lines BL may extend on the peripheral circuit region PCR and may be connected to the second peripheral contact plug 143.

A conductive connecting pattern GS may be formed to electrically connect the conductive isolation patterns CI with each other. The conductive connecting pattern GS may be formed on a fourth interlayer dielectric layer 115 covering the bit lines BL. The conductive connecting pattern GS may be electrically connected to the conductive isolation patterns CI via first contact plugs 147 penetrating the first to fourth interlayer dielectric layers 115, 117, 118, and 119. In some embodiments, at least a portion of the first contact plugs 147 may be formed using the same process as that for forming the lower contact plugs 144. According to the afore-described embodiments, the conductive connecting pattern GS may be formed at a vertical level higher than those of the bit lines BL. However, embodiments may not be limited thereto, e.g., the conductive connecting pattern GS may be formed before the formation of the bit lines BL, such that it is disposed below the bit lines BL. Alternatively, the conductive connecting pattern GS and the bit lines BL may be simultaneously formed.

Figure 13:
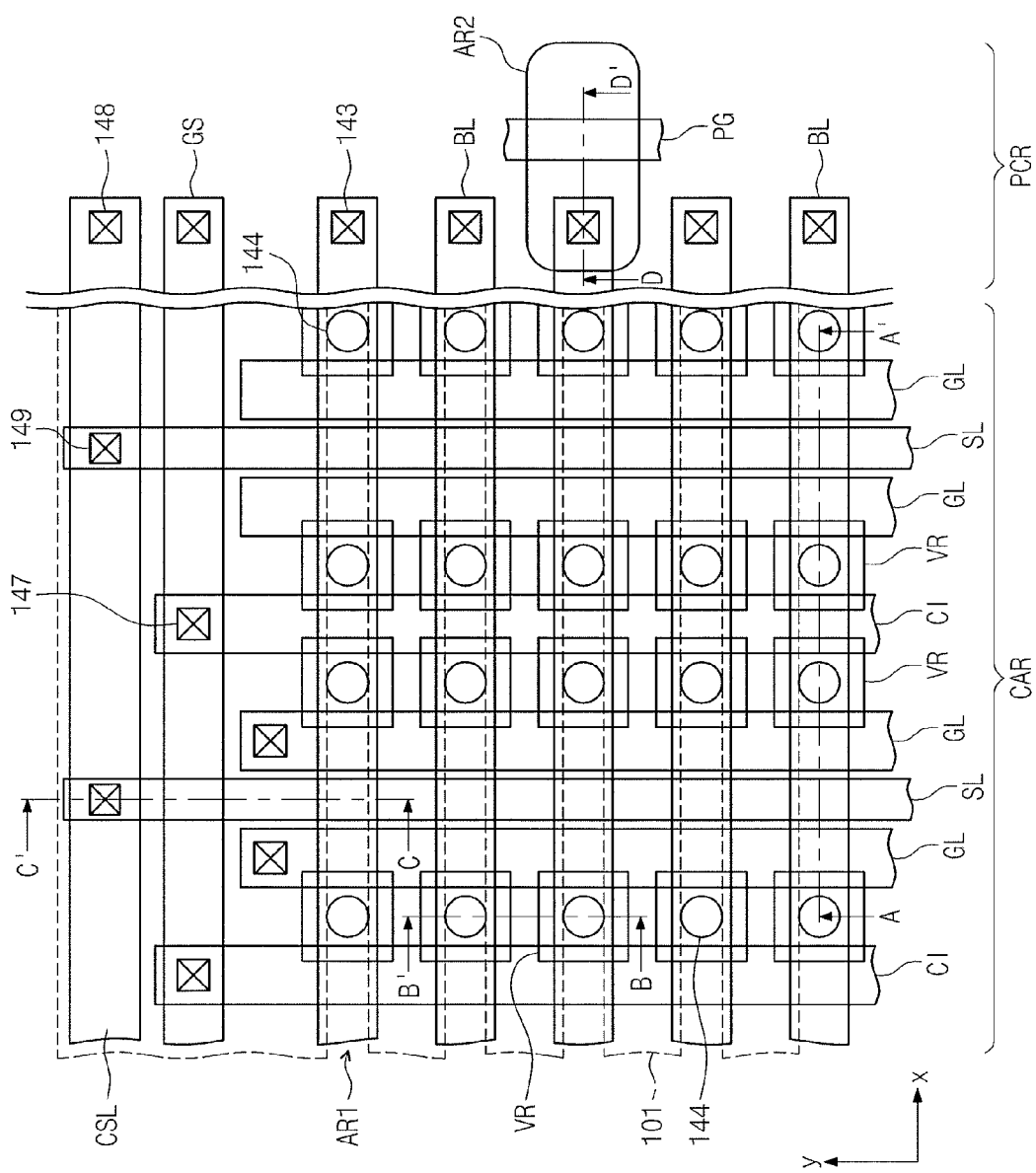
FIG. 13 illustrates a plan view of a data storing device according to an exemplary embodiment.
Figure 14A:
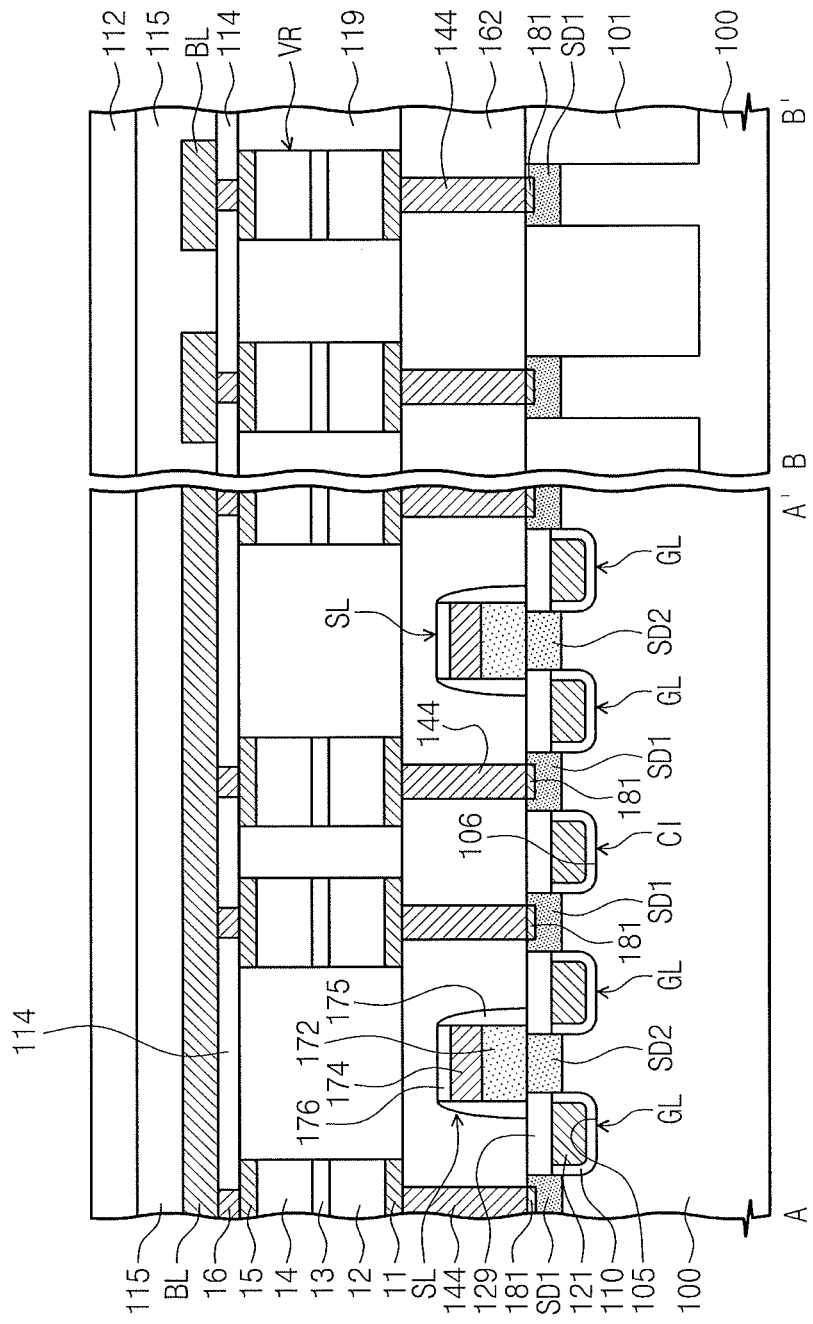
FIGS. 14A and 14B illustrate sectional views of the data storing device illustrated in FIG. 13.
Figure 14B:
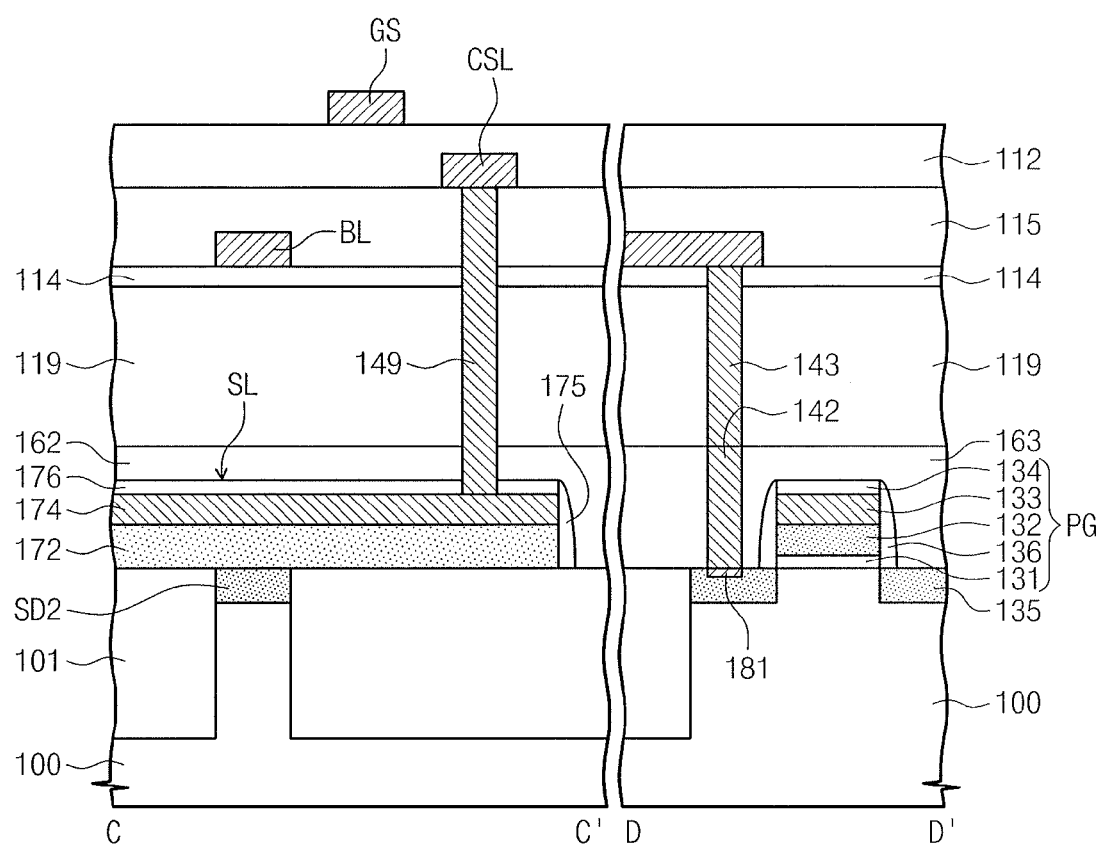

FIG. 13 is a plan view of a data storing device according to a second embodiment. FIGS. 14A and 14B are sectional views of a data storing device according to the second embodiment. In more detail, FIGS. 14A and 14B are sectional views taken along lines A-A', B-B', C-C', and D-D' of FIG. 13. For the sake of brevity, the elements and features of this example that are similar to those previously shown and described will not be described in much further detail.

Referring to FIGS. 13 and 14A through 14B, source lines SL may be connected the common source line CSL via second contact plugs 149. Each of the source lines SL may include a first conductive pattern 172 connected to second source/drain regions SD2 and a second conductive pattern 174 provided on the first conductive pattern 172. The first conductive pattern 172 may include a semiconductor material. For instance, the first conductive pattern 172 may be formed of a doped silicon layer. The second conductive pattern 174 may be a metal-containing layer. For instance, the second conductive pattern 174 may include at least one of metals, conductive metal nitrides, and/or metal-semiconductor compounds.

In some embodiments, each of the source lines SL may include a third capping pattern 176 disposed on the second conductive pattern 174. The third capping pattern 176 may extend along a direction, e.g., the y direction, that is parallel to the first and second conductive patterns 172 and 174. In some embodiments, the third capping pattern 176 may include at least one of a silicon nitride, a silicon oxide, and/or a silicon oxynitride. The source lines SL may further include second spacers 175 disposed on sidewalls of the first and second conductive patterns 172 and 174. The second spacers 175 may extend along the direction that is parallel to the first and second conductive patterns 172 and 174. The second spacer 175 may include at least one of a silicon oxide, a silicon nitride, and/or a silicon oxynitride.

At least a portion of the source lines SL may include the same material as one of layers constituting the peripheral gate electrode structure PG that is provided on the peripheral circuit region PCR. In some embodiments, the second conductive pattern 174 may include the same material as the second gate electrode 133 of the peripheral gate electrode structure PG. For instance, the sameness in material may result from a fabricating method, in which the second conductive pattern 174 and the second gate electrode 133 may be formed using the same process, as will be described below. Similarly, the second spacer 175 may include the same material as the first spacer 136, and the third capping pattern 176 may include the same material as the second capping pattern 134. The source lines SL may be provided in a first interlayer dielectric layer 162, and the peripheral gate electrode structure PG may be provided in a fifth interlayer dielectric layer 163.

The source lines SL may be electrically connected to the source connecting line CSL via the second contact plugs 149 penetrating the interlayer dielectric layers 162, 119, 114, and 115. The source connecting line CSL may be formed on the fourth interlayer dielectric layer 115 covering the bit lines BL as depicted in FIG. 14B. However, embodiments may not be limited thereto, e.g., the source connecting line CSL may be provided below the bit lines BL. In some embodiments, the source connecting line CSL may be provided between the first interlayer dielectric layer 162 and the third interlayer dielectric layer 119 and extend along x direction. Variable resistance structures VR may be electrically connected to the bit lines BL via upper contact plugs 16 penetrating a sixth interlayer dielectric layer 114. All other elements, except for those described above, may be configured to have the same or similar technical features as those discussed above.

FIGS. 15A through 21A and 15B through 21B illustrate sectional views depicting stages in methods of fabricating a data storing device according to exemplary embodiments. In more detail, FIGS. 15A through 21A illustrate sectional views taken along lines A-A' and B-B' of FIG. 13, FIGS. 15B through 21B illustrate sectional views taken along lines C-C' and D-D' of FIG. 13. For the sake of brevity, the elements and features of this example that are similar to those previously shown and described will not be described in much further detail.

Figure 15A:
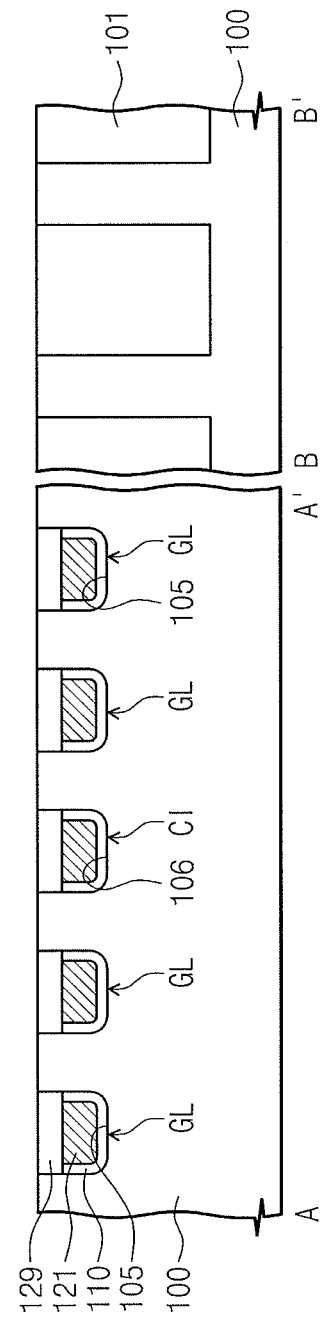
Figure 15B:
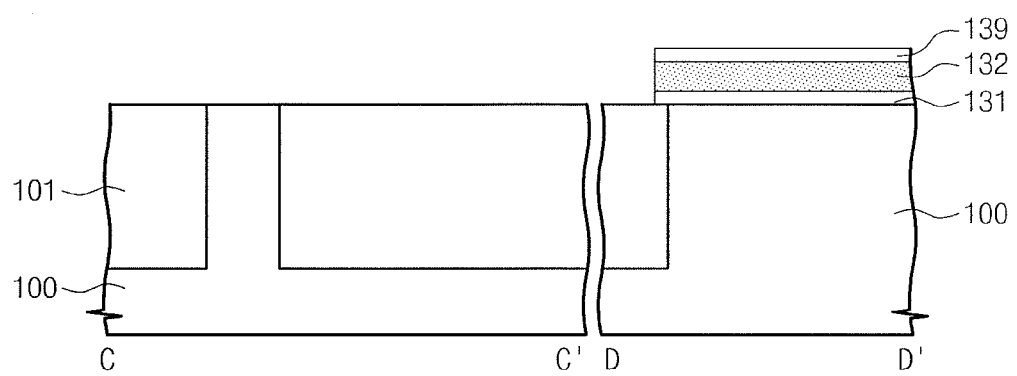

Referring to FIGS. 13, 15A, and 15B, a device isolation layer 101 may be formed in a substrate 100 to define a first active region AR1 in a cell array region CAR and a second active region AR2 in a peripheral circuit region PCR. Trenches extending along the y direction may be formed in the cell array region CAR and excluded in the peripheral circuit region PCR. The trenches may include first trenches 105 and second trenches 106. Gate line structures GL may be formed in the first trenches 105, respectively, and conductive isolation patterns CI may be formed in the second trenches 106, respectively.

A gate insulating layer 131, a first gate electrode 132, and a capping insulating layer 139 may be sequentially formed on the structure provided with the gate line structures GL and the conductive isolation patterns CI. The gate insulating layer 131, the first gate electrode 132, and the capping insulating layer 139 may be formed on the entire surface of the substrate 100, and then may be patterned to locally remain on the peripheral circuit region PCR. In some embodiments, the gate insulating layer 131 may include at least one of a silicon oxide, a silicon nitride, and/or a silicon oxynitride. The first gate electrode 132 may include a semiconductor material, such as a doped silicon layer. The capping insulating layer 139 may include at least one of a silicon nitride, a silicon oxide, and/or a silicon oxynitride.

Figure 16A:
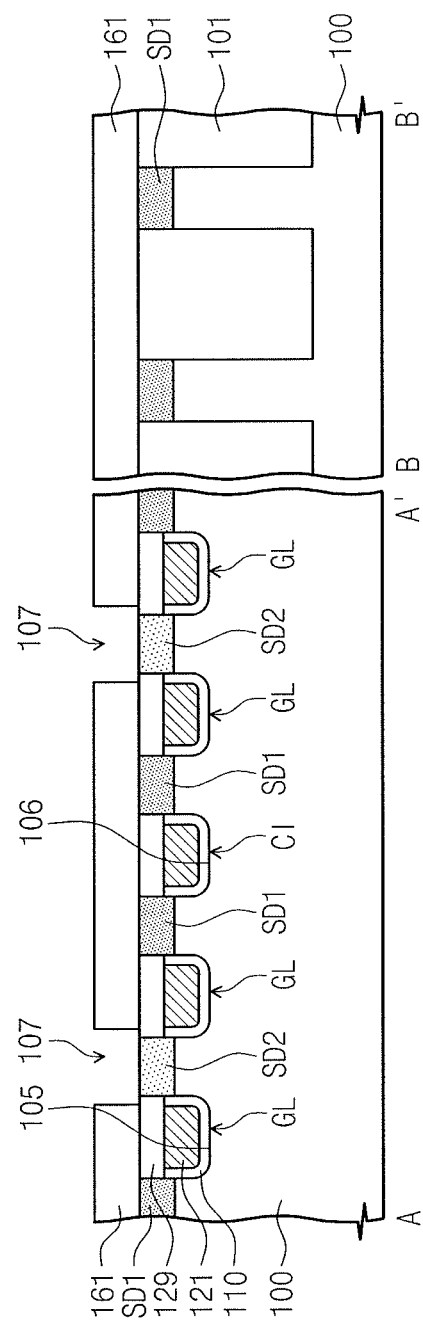
Figure 16B:
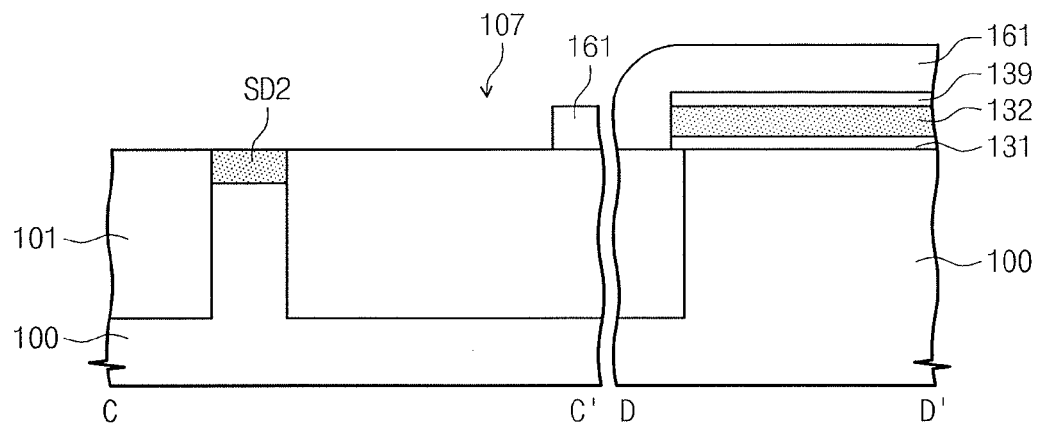

Referring to FIGS. 13, 16A, and 16B, first and second source/drain regions SD1 and SD2 may be formed in the cell array region CAR. The first source/drain regions SD1 may be formed in the substrate 100 between the gate line structures GL and the conductive isolation patterns CI. The second source/drain regions SD2 may be formed in the substrate 100 between the gate line structures GL. In some embodiments, the first and second source/drain regions SD1 and SD2 may be formed by injecting impurities with a different conductivity type from the substrate 100 into the substrate 100. In some embodiments, the first and second source/drain regions SD1 and SD2 may be simultaneously formed using the same process. In other embodiments, at least one of the first and second source/drain regions SD1 and SD2 may be formed using another ion implantation process. Here, since the capping insulating layer 139 and layers disposed thereunder cover the peripheral circuit region PCR, the peripheral circuit region PCR may not be doped during the formation of the first and second source/drain regions SD1 and SD2.

A second insulating layer 161 may be formed to cover the gate line structures GL and the conductive isolation patterns CI. Subsequently, the second insulating layer 161 may be patterned to form second recess regions 107 exposing the second source/drain regions SD2. In some embodiments, the second recess regions 107 may be formed between adjacent ones of the gate line structures GL and be formed to have a trench shape extending along the gate line structures GL. The second insulating layer 161 may include at least one of a silicon oxide, a silicon nitride, and/or a silicon oxynitride.

Figure 17B:
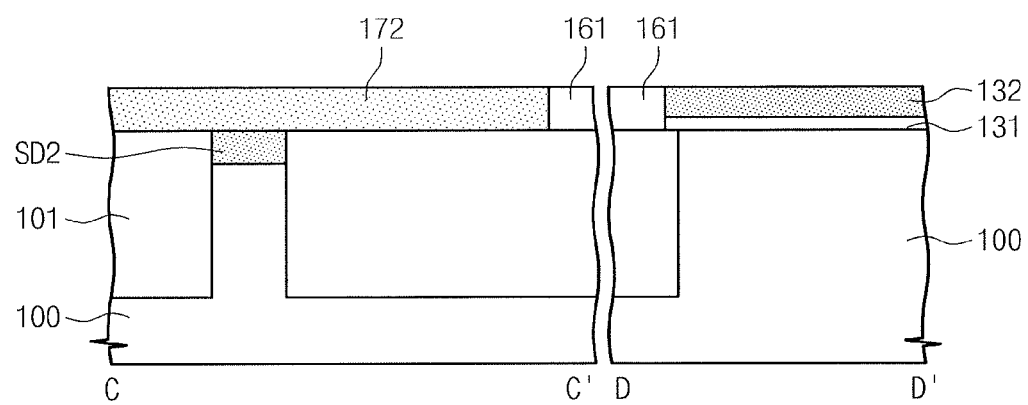

Referring to FIGS. 13, 17A, and 17B, first conductive patterns 172 may be formed in the second recess regions 107. The first conductive patterns 172 may include a semiconductor material. For example, the first conductive patterns 172 may include a doped silicon layer. The formation of the first conductive patterns 172 may include forming a conductive layer to fill the second recess regions 107, and then performing a planarization process to expose the second insulating layer 161. As the result of the planarization process, the capping insulating layer 139 may be removed from the peripheral circuit region PCR to expose a top surface of the first gate electrode 132. The planarization process may be performed using at least one of an etch-back method and/or a chemical mechanical polishing (CMP) method.

Figure 18A:
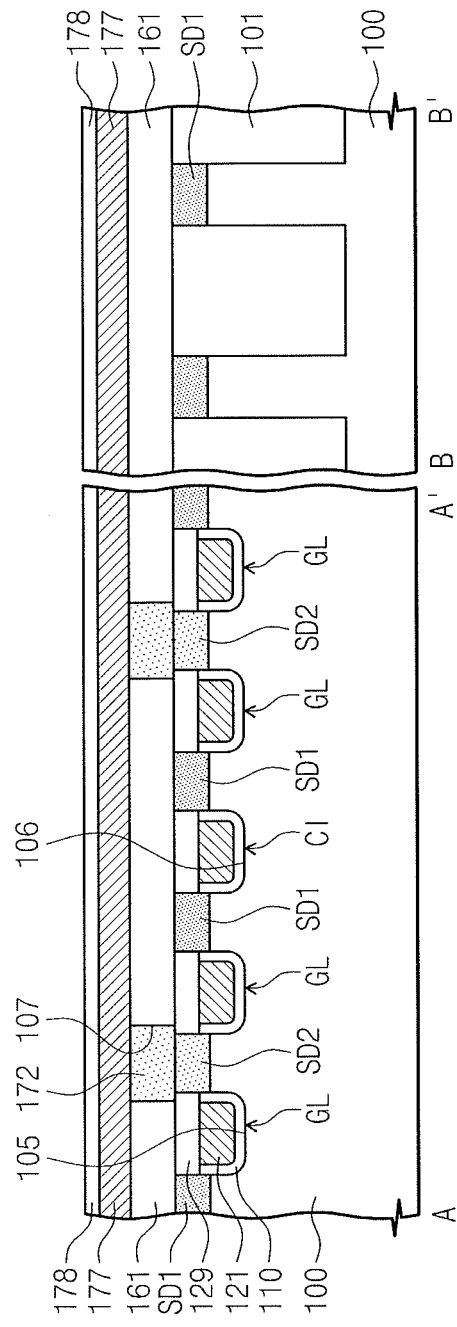
Figure 18B:
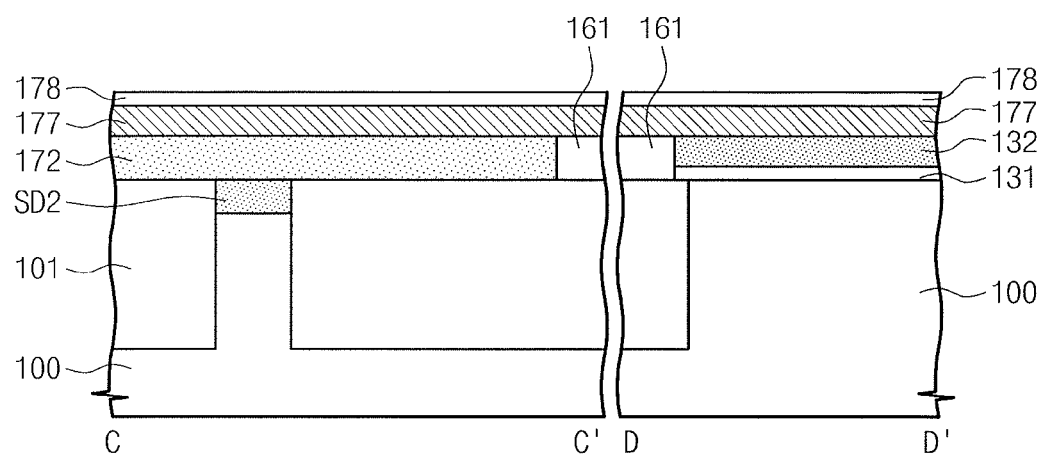

Referring to FIGS. 13, 18A, and 18B, a second conductive layer 177 and a capping layer 178 may be formed on the structure provided with the first conductive patterns 172. The second conductive layer 177 and the capping layer 178 may be formed on both of the cell array region CAR and the peripheral circuit region PCR. The second conductive layer 177 may include at least one of metals, conductive metal nitrides, and/or metal-semiconductor compounds. The capping layer 178 may include at least one of a silicon nitride, a silicon oxide, and/or a silicon oxynitride. In some embodiments, when the first conductive patterns 172 are formed of doped silicon and the second conductive layer 177 is a metal-containing layer, a metal-silicide layer (not shown) may be formed between the first conductive patterns 172 and the second conductive layer 177.

Figure 19A:
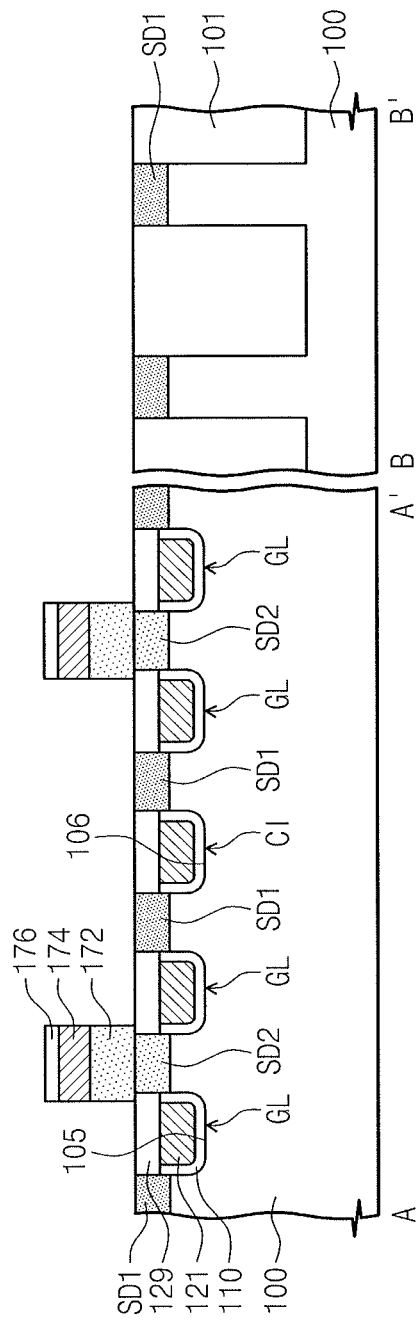
Figure 19B:
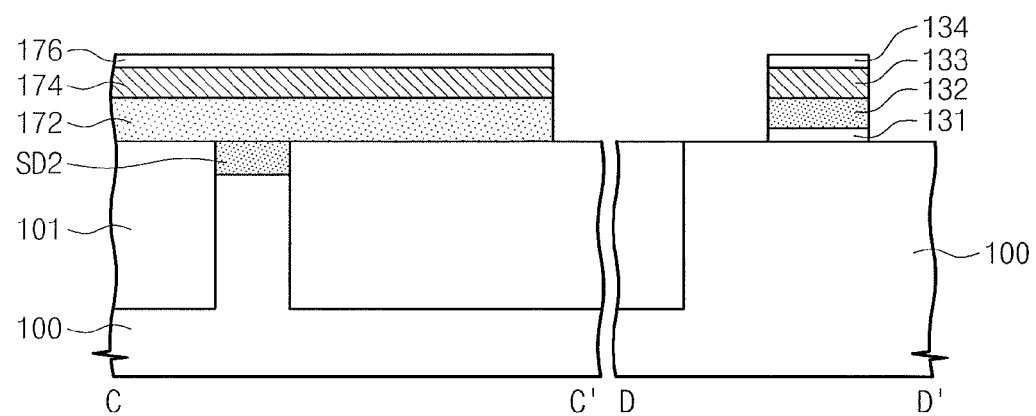

Referring to FIGS. 13, 19A, and 19B, the second conductive layer 177 and the capping layer 178 may be patterned to form a second conductive pattern 174 and a third capping pattern 176, which may be disposed on the first conductive patterns 172, and a second gate electrode 133 and a second capping pattern 134, which may be disposed on the first gate electrode 132. In some embodiments, the patterning may be performed to etch a portion of the first conductive pattern 172. Furthermore, the gate insulating layer 131 and the first gate electrode 132 may be etched along with the second conductive layer 177 to expose a portion of the substrate 100 in the peripheral circuit region PCR.

Figure 20A:
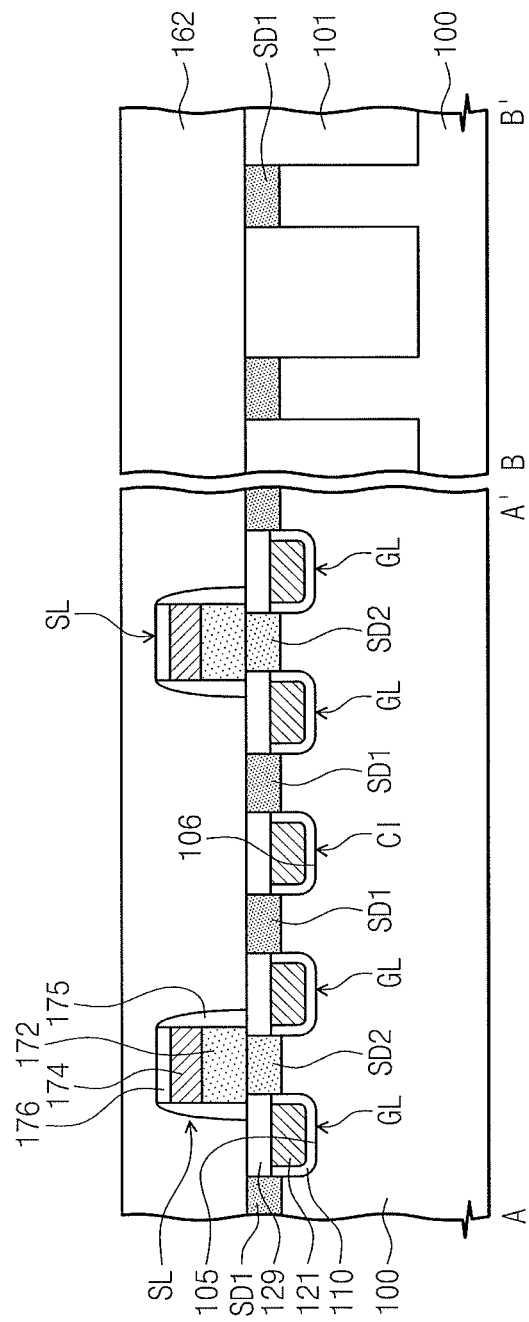
Figure 20B:
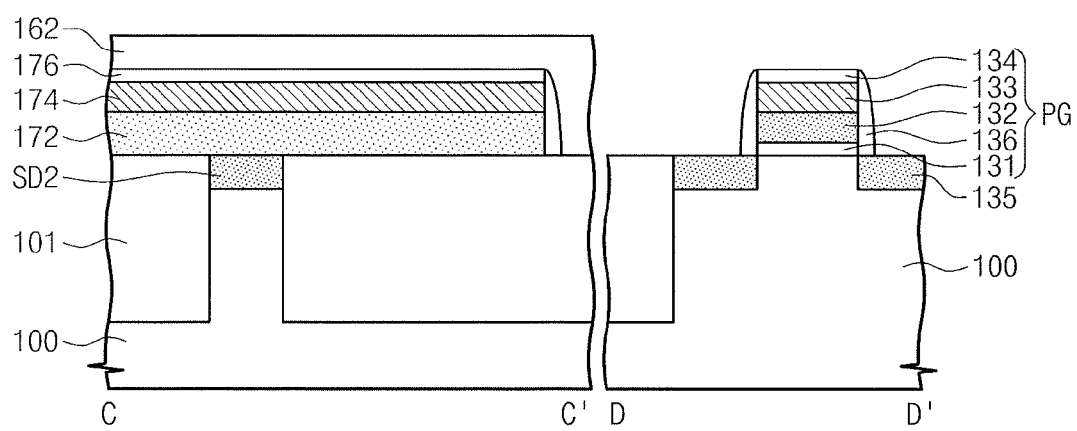

Referring to FIGS. 13, 20A, and 20B, a spacer-forming process may be performed to form second spacers 175 on sidewalls of the first and second conductive patterns 172 and 174 and first spacers 136 on sidewalls of the first and second gate electrodes 132 and 133. In some embodiments, the first and second spacers 136 and 175 may be formed of a silicon oxide. For example, the first and second conductive patterns 172 and 174, the third capping pattern 176, and the second spacer 175, which are formed in the cell array region CAR, may constitute a source lines SL, and the gate insulating layer 131, the first and second gate electrodes 132 and 133, the second capping pattern 134, and the first spacer 136, which are formed in the peripheral circuit region PCR, may constitute a peripheral gate electrode structure PG.

After the formation of the first and second spacers 136 and 175, a first interlayer dielectric layer 162 may be formed to cover the cell array region CAR. The first interlayer dielectric layer 162 may be formed to expose the peripheral circuit region PCR. Third source/drain regions 135 may be formed in the peripheral circuit region PCR of the substrate 100 exposed by the first interlayer dielectric layer 162. The third source/drain regions 135 may be formed by an ion implantation process using the first interlayer dielectric layer 162 and the peripheral gate electrode structure PG as a mask.

Figure 21A:
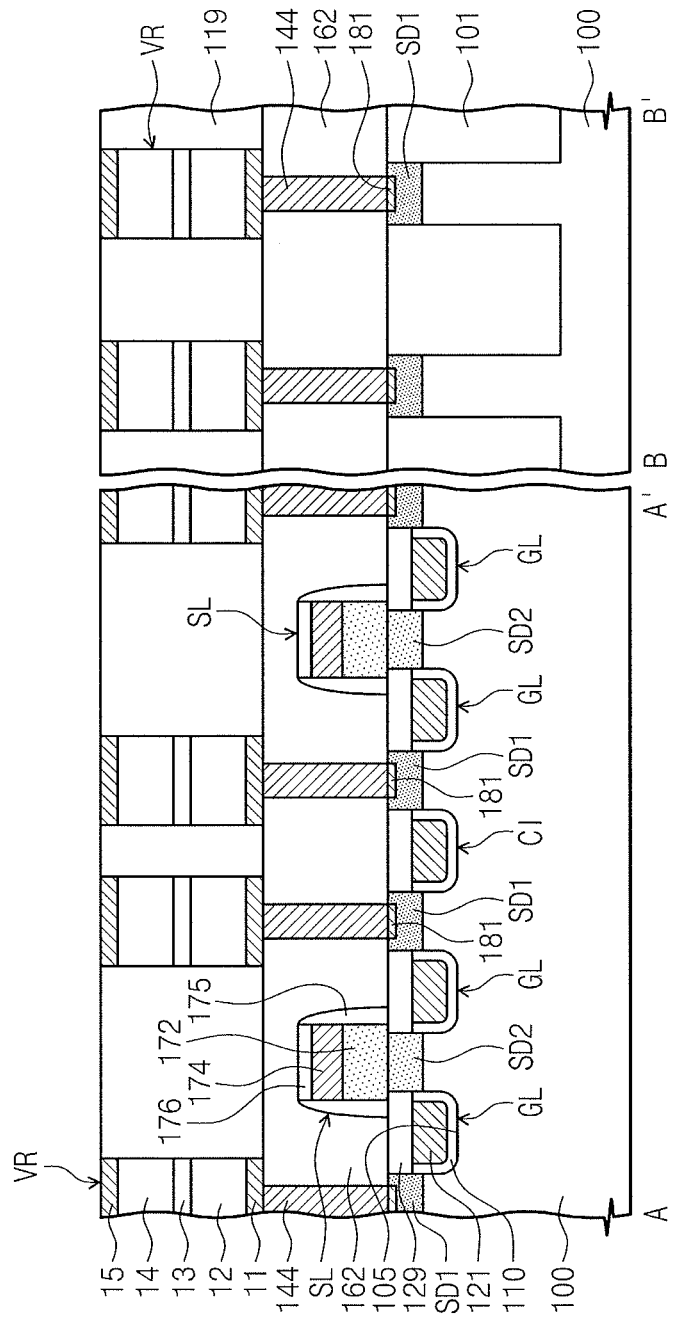
Figure 21B:
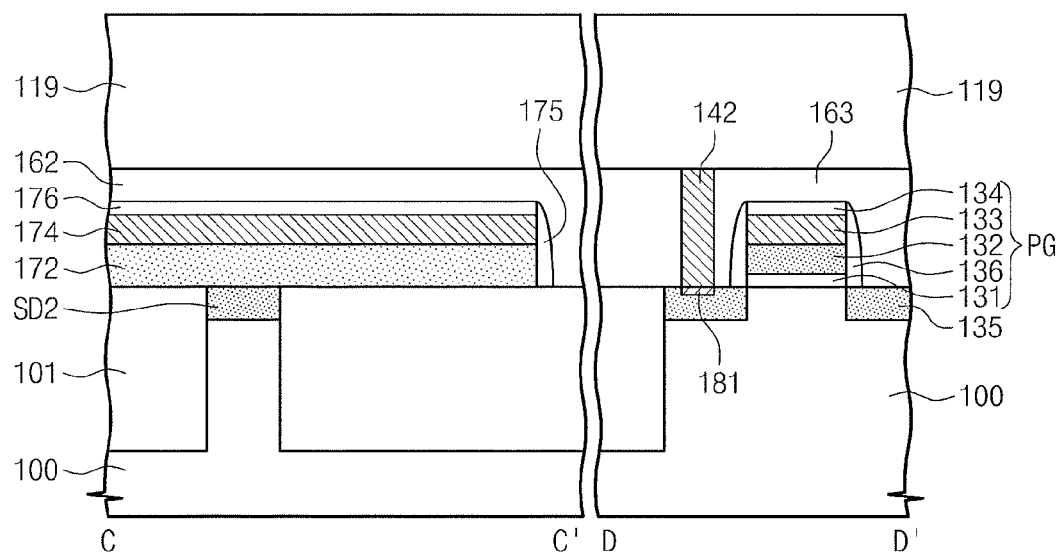

Referring to FIGS. 13, 21A, and 21B, a fifth interlayer dielectric layer 163 may be formed to cover the peripheral circuit region PCR, and lower contact plugs 144 and first peripheral contact plugs 142 may be formed to penetrate the interlayer dielectric layers 162 and 163. The lower and first peripheral contact plugs 144 and 142 may be electrically connected to the first and third source/drain regions SD1 and 135, respectively. In some embodiments, first metal-silicide layers 181 may be formed between the first and third source/drain regions SD1 and 135 and the lower and first peripheral contact plugs 144 and 142, respectively.

Variable resistance structures VR may be formed on the first source/drain regions SD1. The variable resistance structures VR may be electrically connected to the first source/ drain regions SD1 via the lower contact plugs 144. The formation of the variable resistance structures VR may include sequentially forming a first electrode 11, a reference magnetic layer 12, a tunnel barrier layer 13, a free layer 14, and a second electrode 15 on the lower contact plugs 144, and patterning the resultant structure to form the variable resistance structures VR disposed on the lower contact plugs 144, respectively. The patterning process may include a plurality of etching steps. After the formation of the variable resistance structures VR, the third interlayer dielectric layer 119 may be formed by depositing an insulating layer to fill a space between the variable resistance structures VR.

Referring back to FIGS. 13, 14A, and 14B, bit lines BL may be formed to connect the variable resistance structures VR with each other along the x direction. In some embodiments, before the formation of the bit lines BL, a sixth interlayer dielectric layer 114 may be formed to cover the variable resistance structures VR, and upper contact plugs 16 may be formed to penetrate the sixth interlayer dielectric layer 114. The upper contact plugs 16 may be connected to the variable resistance structures VR, respectively.

Before the formation of the bit lines BL, second peripheral contact plugs 143 may be formed to be in contact with the first peripheral contact plugs 142, respectively. The formation of the second peripheral contact plugs 143 may include forming contact holes penetrating the third interlayer dielectric layer 119 and exposing the second peripheral contact plug 142. In some embodiments, the bit lines BL may extend on the peripheral circuit region PCR and may be connected to the second peripheral contact plug 143.

A source connecting line CSL may be formed to electrically connect the source lines SL with each other. A fourth interlayer dielectric layer 115 may be formed to cover the bit lines BL, and then, second peripheral contact plugs 149 may be formed to penetrate interlayer dielectric layers 162, 119, 114, and 115. The second peripheral contact plugs 149 may be formed in contact holes, respectively, each of which penetrates the third capping pattern 176 and exposes the second conductive pattern 174. The source connecting line CSL may extend along the x direction and be electrically connected to the source lines SL. For instance, the source connecting line CSL may extend on the peripheral circuit region PCR. As described above, the source connecting line CSL may be variously modified to have one of shapes capable of connecting the source lines SL with each other. However, embodiments may not be limited to that depicted in the drawings.

A conductive connecting pattern GS may be formed to electrically connect the conductive isolation patterns CI with each other. The conductive connecting pattern GS may be formed on a seventh interlayer dielectric layer 112 covering the source connecting line CSL. Alternatively, the conductive connecting pattern GS and the source connecting line CSL may be simultaneously formed, or the conductive connecting pattern GS may be formed before the formation of the source connecting line CSL. The conductive connecting pattern GS may be formed by the same method as that described with reference to FIG. 2C, and thus, it may have the same shape that described with reference to FIG. 2C.

The data storing devices disclosed above may be encapsulated using various and diverse packaging techniques. For example, the data storing devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a thin quad flat package (TQFP) technique, a system in package (SIP) technique, a multi-chip package (MCP) technique, a wafer-level fabricated package (WFP) technique and a wafer-level processed stack package (WSP) technique. The package in which the data storing device according to one of the above embodiments is mounted may further include at least one semiconductor device (e.g., a controller and/or a logic device) that controls the data storing device.

Figure 22:
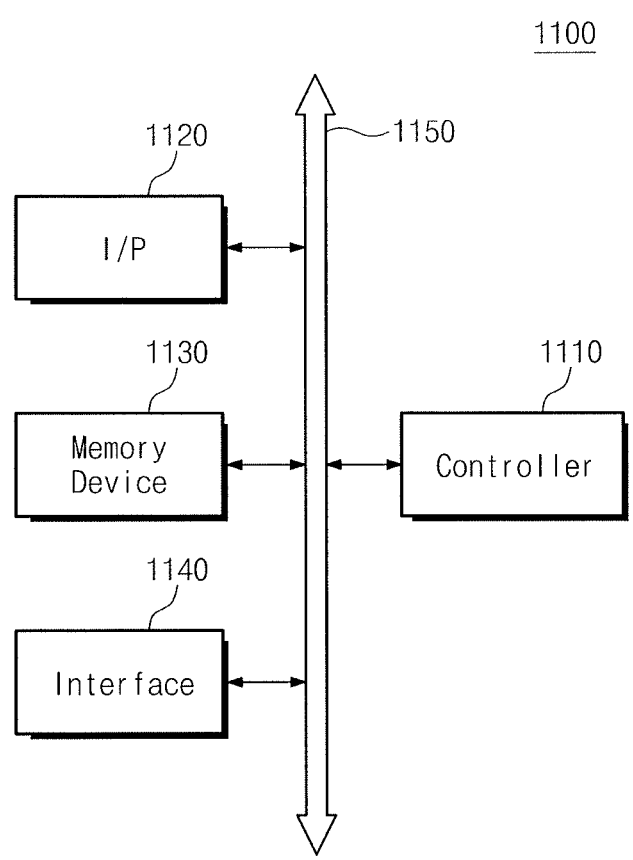
FIG. 22 illustrates a schematic block diagram of exemplary electronic systems including data storing devices according to exemplary embodiments.

FIG. 22 illustrates a schematic block diagram of exemplary electronic systems including data storing devices according to exemplary embodiments.

Referring to FIG. 22, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and/or another logic device. The other logic device may have a similar function to any one of the microprocessor, the digital signal processor, and the microcontroller. The I/O unit 1120 may include a keypad, a keyboard, and/or a display unit. The memory device 1130 may store data and/or commands. The memory device 1130 may include at least one of the data storing devices according to the embodiments described above. The memory device 1130 may further include another type of data storing devices which are different from the data storing devices described above.

The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. Although not shown in the drawings, the electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card, or an electronic product. The electronic product may receive or transmit information data by wireless.

Figure 23:
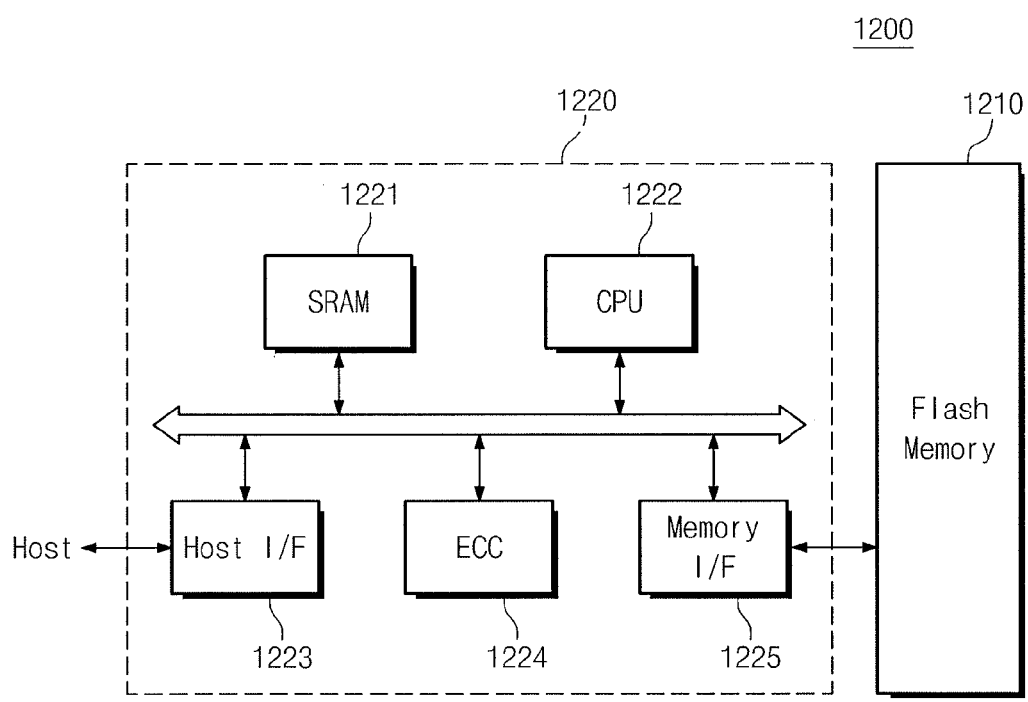
FIG. 23 illustrates a schematic block diagram of exemplary memory cards including data storing devices according to exemplary embodiments.

FIG. 23 illustrates a schematic block diagram of exemplary memory cards including data storing devices according to exemplary embodiments.

Referring to FIG. 23, a memory card 1200 according to an embodiment may include a memory device 1210, e.g., a flash memory device 1210. The memory device 1210 may include at least one of the data storing devices according to the various embodiments mentioned above. In other embodiments, the memory device 1210 may further include another type of data storing devices which are different from the data storing devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. The memory controller 1220 may include an SRAM device 1221 used as, e.g., an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may replace hard disks of computer systems as solid state disks (SSD) of the computer systems.

By way of summation and review, transistors, e.g., planar metal-oxide-semiconductor field effect transistors (MOS FET), may be used as cell transistors in a memory device, e.g., a magnetic random access memory (MRAM). However, in the case that gate patterns of the planar MOS FETs have relatively small widths, e.g., widths of about 30 nm or less, there may be difficulties in obtaining adequate electrical characteristics for use as switching transistors. Accordingly, the planar MOS FETs may be unsuitable as switching elements for a high-density memory device.

Embodiments relate to a memory device, e.g., a high-density magnetic memory device, in which transistors having three-dimensional structures may be used as the cell transistors. Further, it may be possible to form an ISO GATE electrically isolating gate lines from each other, in conjunction with a formation of a buried transistor with respect to the three-dimensional structures. Accordingly, exemplary embodiments may provide data storing devices with an increased integration density and/or methods of fabricating a high-density data storing device with ease.

For example, a data storing device may include conductive isolation patterns that are buried in a substrate to, e.g., alleviate a short channel effect of the data storing device. Further, a source line pattern serving as a common source line of adjacent transistors may be provided so that, e.g., an increase in the integration density of the data storing device may be realized. Also, it may be possible to form the conductive isolation patterns, with ease and simplicity, e.g., an isolation structure electrically isolating gate line structures may be formed with ease and simplicity.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A data storing device, comprising:
a substrate;
transistors on the substrate, the transistors including gate line structures and second source/drain regions in the substrate between the gate line structures; and
conductive isolation patterns defining active regions of the transistors, each conductive isolation pattern including at least one portion buried in the substrate, and the conductive isolation patterns being electrically connected with each other, wherein source lines are disposed on the second source/drain regions and extend along the gate line structures.

2. The device as claimed in claim 1, wherein:
each of the gate line structures includes at least one portion buried in the substrate, and
the conductive isolation patterns extend substantially parallel to the gate line structures.

3. The device as claimed in claim 2, wherein:
each of the conductive isolation patterns and the gate line structures includes an insulating layer, a conductive line, and a capping pattern that are sequentially stacked on the substrate, and
the conductive line is electrically isolated from the substrate by the insulating layer and the capping pattern.

4. The device as claimed in claim 3, wherein, in each of the conductive isolation patterns and the gate line structures, an uppermost surface of the conductive line is lower than an uppermost surface of the substrate.

5. The device as claimed in claim 2, wherein the gate line structures are provided in first trenches within the substrate and the conductive isolation patterns are provided in second trenches within the substrate, the first trenches and the second trenches having substantially same depths.

6. The device as claimed in claim 1, further comprising a conductive connecting pattern electrically connecting the conductive isolation patterns with each other, the conductive connecting pattern extending along a direction that crosses the gate line structures.

7. The device as claimed in claim 1, wherein the conductive isolation patterns reduce formation of a channel region in regions of the substrate under the conductive isolation patterns, during an operation of the data storing device.

8. The device as claimed in claim 1, wherein the conductive isolation patterns are configured to receive a ground or negative voltage, during an operation of the data storing device.

9. The device as claimed in claim 1, wherein the conductive isolation patterns are configured to have applied thereto a same voltage as that applied to unselected gate line structures of the gate line structures, during reading and writing operations of the data storing device.

10. The device as claimed in claim 1 wherein:
the transistors further include:
first source/drain regions spaced apart from the second source/drain regions by the gate line structures.

11. The device as claimed in claim 10, further comprising a source connecting line electrically connecting the source lines with each other.

12. The device as claimed in claim 10, wherein the gate line structures include conductive lines, respectively, and lowermost surfaces of the source lines are higher than uppermost surfaces of the conductive lines.

13. The device as claimed in claim 10, further comprising device isolation layers crossing the gate line structures and defining the active regions of the transistors, the second source/drain regions being spaced apart from each other by the device isolation layers in a direction parallel to the gate line structures.

14. The device as claimed in claim 10, wherein each of the source lines includes:

a first conductive pattern in contact with the one of the second source/drain regions, the first conductive pattern including a semiconductor material, and a second conductive pattern on the first conductive pattern, the second conductive pattern including a metallic material.

15. The device as claimed in claim 10, further comprising variable resistance structures, each of the variable resistance structures being electrically connected to a corresponding one of the first source/drain regions.

* * * * *